US009882171B2

(12) United States Patent
Hirai et al.

(10) Patent No.: US 9,882,171 B2
(45) Date of Patent: Jan. 30, 2018

(54) PIXEL MATRIX CIRCUIT

(71) Applicant: COMMONWEALTH SCIENTIFIC AND INDUSTRIAL RESEARCH ORGANISATION, Australian Captial Territory (AU)

(72) Inventors: Tadahiko Hirai, Mount Waverly (AU); Kazunori Ueno, Glen Waverly (AU); Brett Alexander Sexton, Burnside (AU)

(73) Assignee: COMMONWEALTH SCIENTIFIC AND INDUSTRIAL RESEARCH ORGANISATION, Campbell, Australian Capital Territory (AU)

( * ) Notice: Subject to any disclaimer, the term of this patent is extended or adjusted under 35 U.S.C. 154(b) by 78 days.

(21) Appl. No.: 14/896,120

(22) PCT Filed: Jun. 6, 2014

(86) PCT No.: PCT/AU2014/000595
§ 371 (c)(1),
(2) Date: Dec. 4, 2015

(87) PCT Pub. No.: WO2014/194372
PCT Pub. Date: Dec. 11, 2014

(65) Prior Publication Data
US 2016/0126504 A1 May 5, 2016

(30) Foreign Application Priority Data

Jun. 7, 2013 (AU) ............................... 2013902072
Jun. 12, 2013 (AU) ............................... 2013902125

(51) Int. Cl.
G09G 5/00 (2006.01)
H01L 51/52 (2006.01)
H01L 27/32 (2006.01)
G09G 3/3258 (2016.01)
(Continued)

(52) U.S. Cl.
CPC ....... *H01L 51/5296* (2013.01); *G09G 3/3258* (2013.01); *G09G 3/3266* (2013.01);
(Continued)

(58) Field of Classification Search
CPC ...... G09G 3/3258; G09G 3/3266; G09G 3/32; G09G 2320/0626; G09G 2300/0809; G09G 2300/0426; G09G 2300/0408
See application file for complete search history.

(56) References Cited

U.S. PATENT DOCUMENTS 5,404,074 A * 4/1995 Watanabe ................ G09G 3/22
313/495
5,528,397 A * 6/1996 Zavracky ................ A61B 3/113
257/347
(Continued)

OTHER PUBLICATIONS

Li et al., "Achieving saturation in vertical organic transistors for organic light-emitting diode driving by nanorod geometric control," Applied Physics Letters, vol. 102, Issue 16, pp. 163305-1-163305-5, Apr. 25, 2013.
(Continued)

*Primary Examiner* — Vijay Shankar
(74) *Attorney, Agent, or Firm* — Foley & Lardner LLP

(57) ABSTRACT

An electroluminescent device comprising: an organic electroluminescent element and a junction transistor having a first region, a second region, and an intermediate semiconducting region configured to control flow of charge between the first and second regions, wherein at least two abutting regions consist essentially of one or more semiconducting inorganic metal compounds, and wherein each region of the junction transistor and the electroluminescent element are successively stacked along a common direction.

24 Claims, 26 Drawing Sheets

A-A Cross section

(51) Int. Cl.
  *G09G 3/3266*      (2016.01)
  *H01L 51/00*       (2006.01)
  *H01L 51/56*       (2006.01)

(52) U.S. Cl.
  CPC ...... *H01L 27/3225* (2013.01); *H01L 27/3244* (2013.01); *H01L 27/3262* (2013.01); *H01L 27/3265* (2013.01); *H01L 27/3276* (2013.01); *H01L 51/001* (2013.01); *H01L 51/5271* (2013.01); *H01L 51/56* (2013.01); *G09G 2300/0408* (2013.01); *G09G 2300/0426* (2013.01); *G09G 2300/0809* (2013.01); *G09G 2320/0626* (2013.01)

(56) References Cited

U.S. PATENT DOCUMENTS

| | | | | |
|---|---|---|---|---|
| 5,661,371 A | * | 8/1997 | Salerno | G02B 27/0093 257/E25.032 |
| 5,858,562 A | * | 1/1999 | Utsugi | H01L 51/0059 313/504 |
| 5,886,474 A | * | 3/1999 | Asai | G09G 3/3216 315/169.1 |
| 6,037,718 A | | 3/2000 | Nagami | |
| 8,629,865 B2 | * | 1/2014 | Loebl | H01L 51/5036 257/89 |
| 2005/0179399 A1 | | 8/2005 | Leo et al. | |
| 2009/0230383 A1 | | 9/2009 | Meng et al. | |
| 2010/0265236 A1 | | 10/2010 | Loebl et al. | |
| 2012/0223978 A1 | | 9/2012 | Yamamoto et al. | |

OTHER PUBLICATIONS

Chao et al., "A 1-V operated polymer vertical transistor with high on/off current ratio," IEEE International Electron Devices Meeting (IEDM), Baltimore, MD, Dec. 7-9, 2009, pp. IEDM09-375-378.

International Search Report dated Aug. 5, 2014 in application No. PCT/AU2014/000595.

* cited by examiner

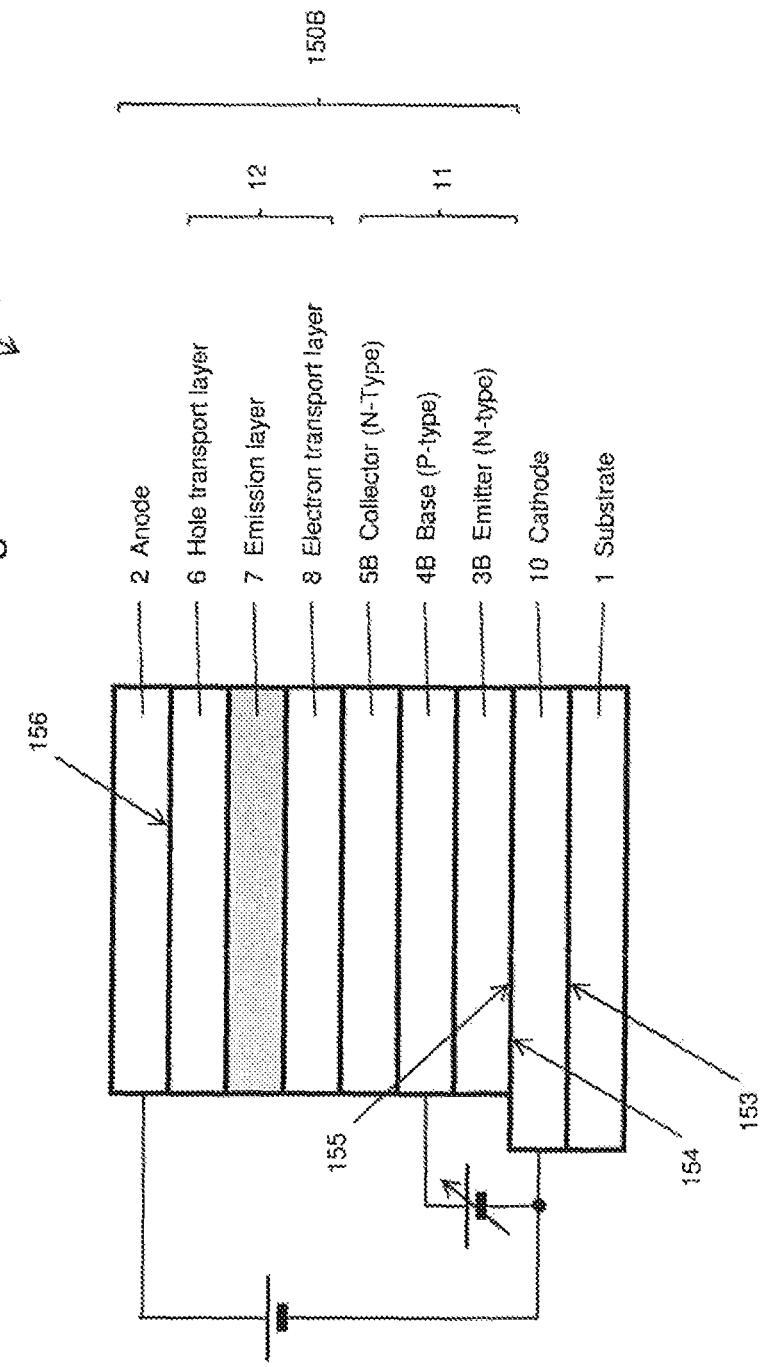

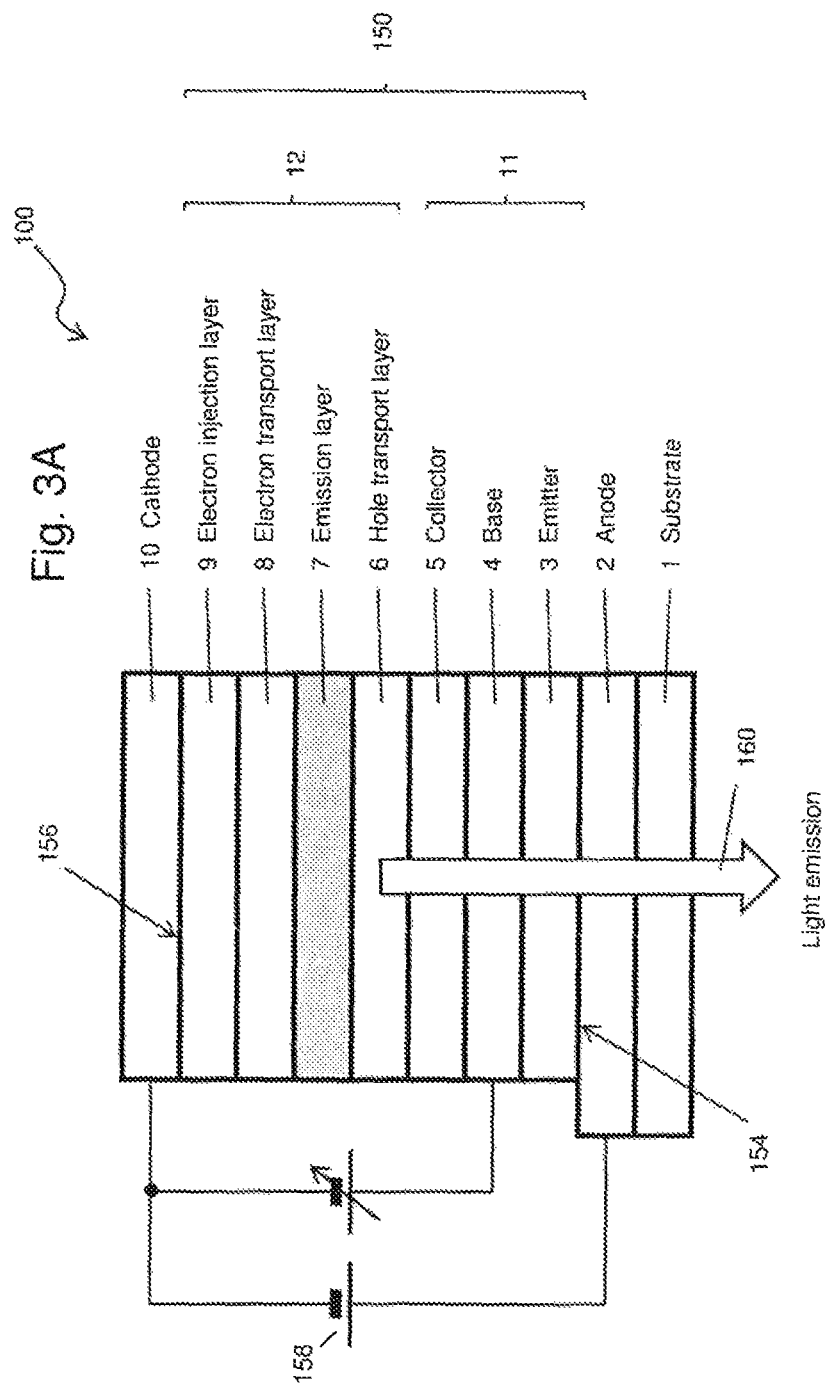

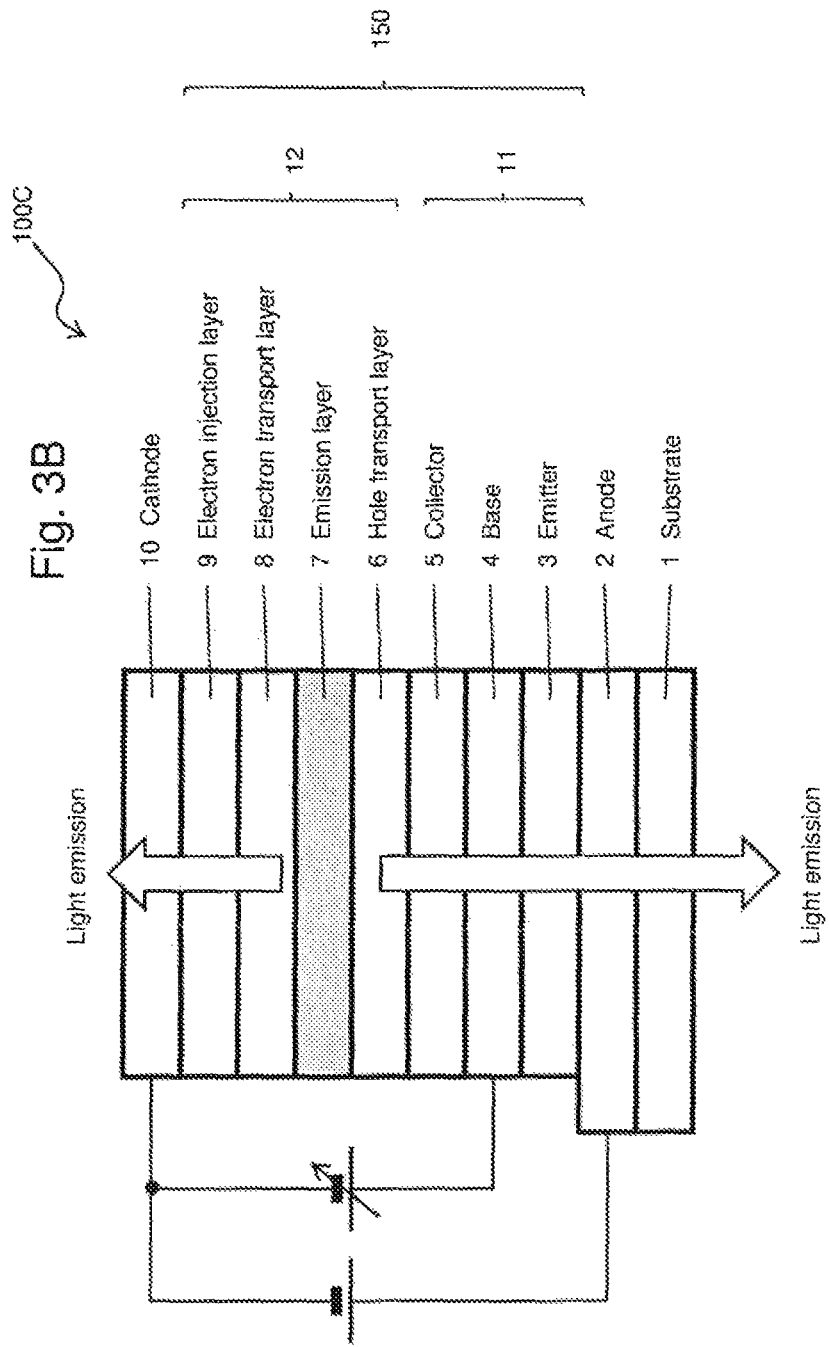

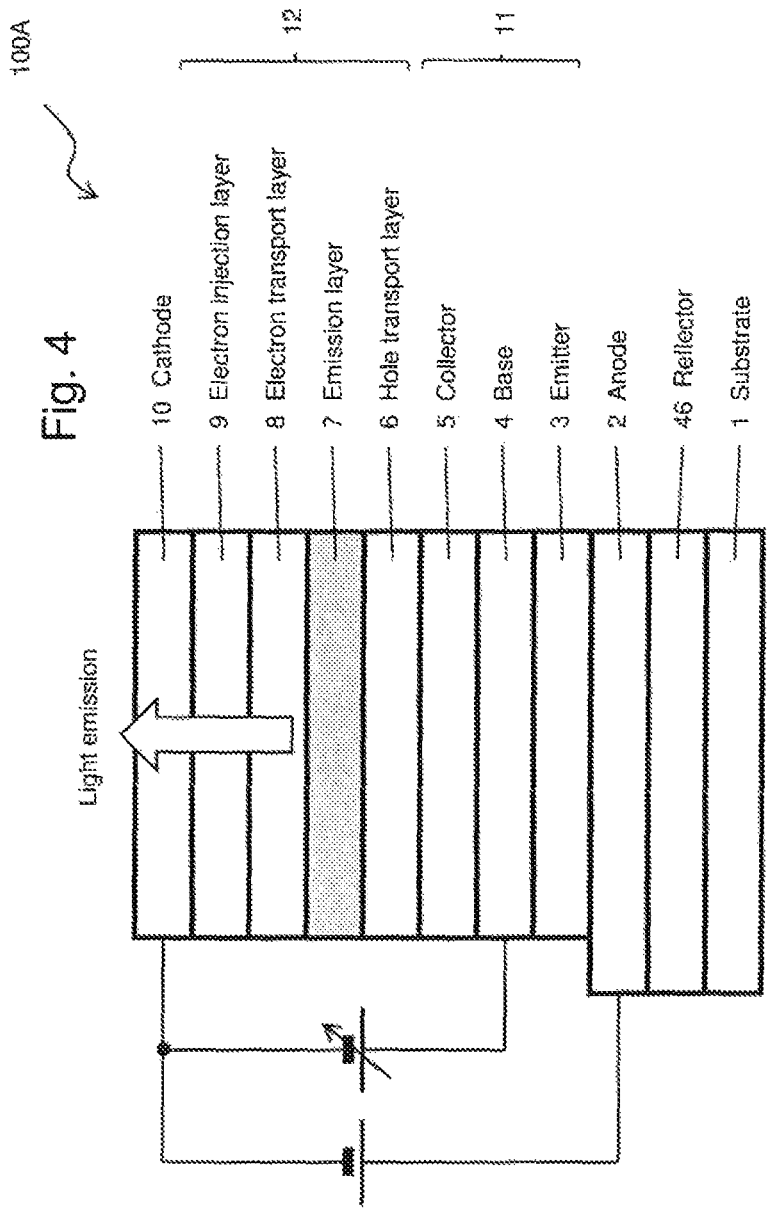

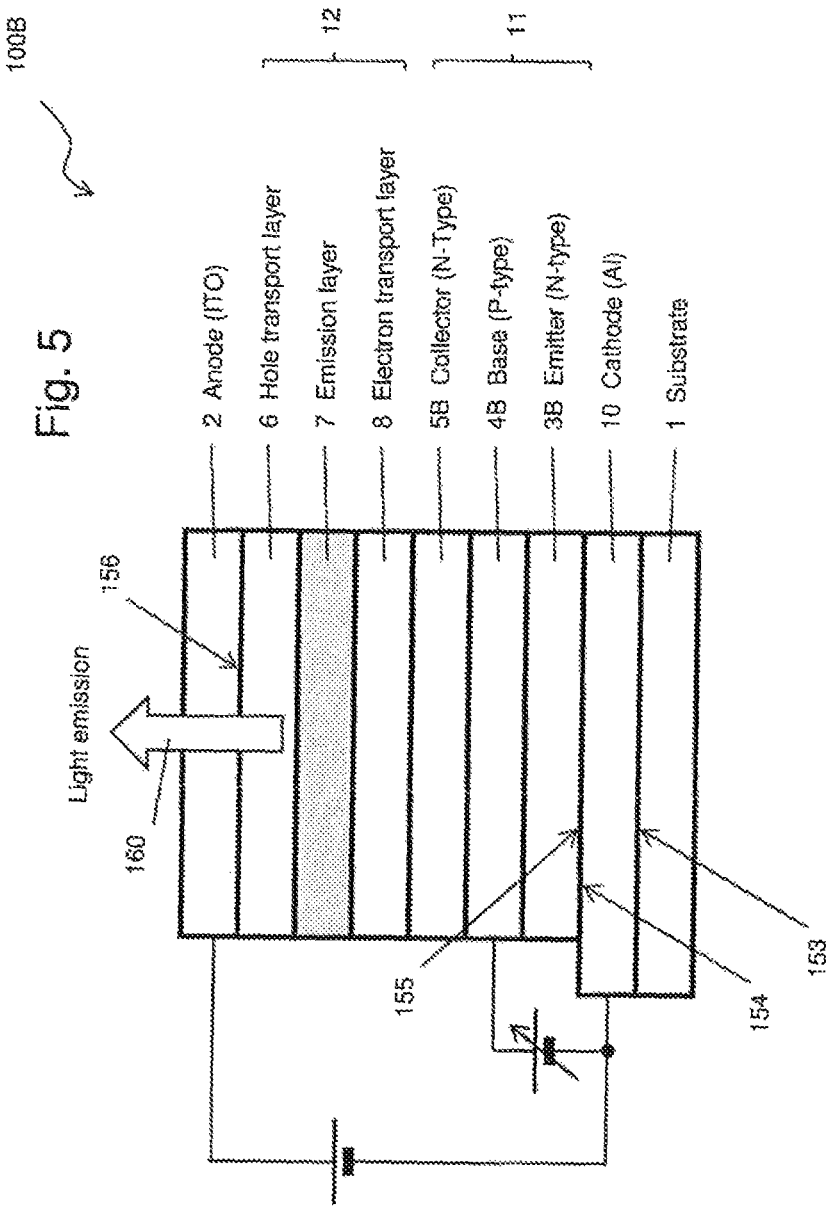

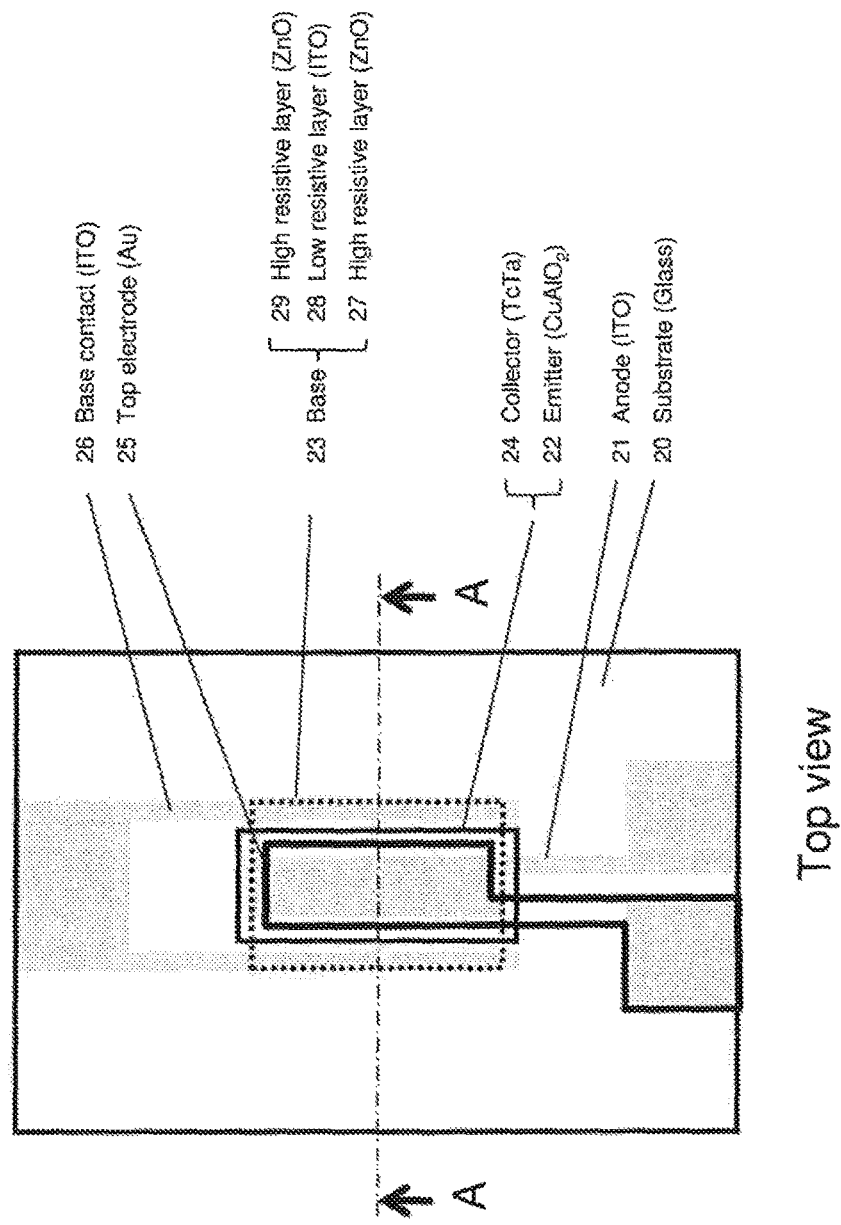
Fig. 6A Top view

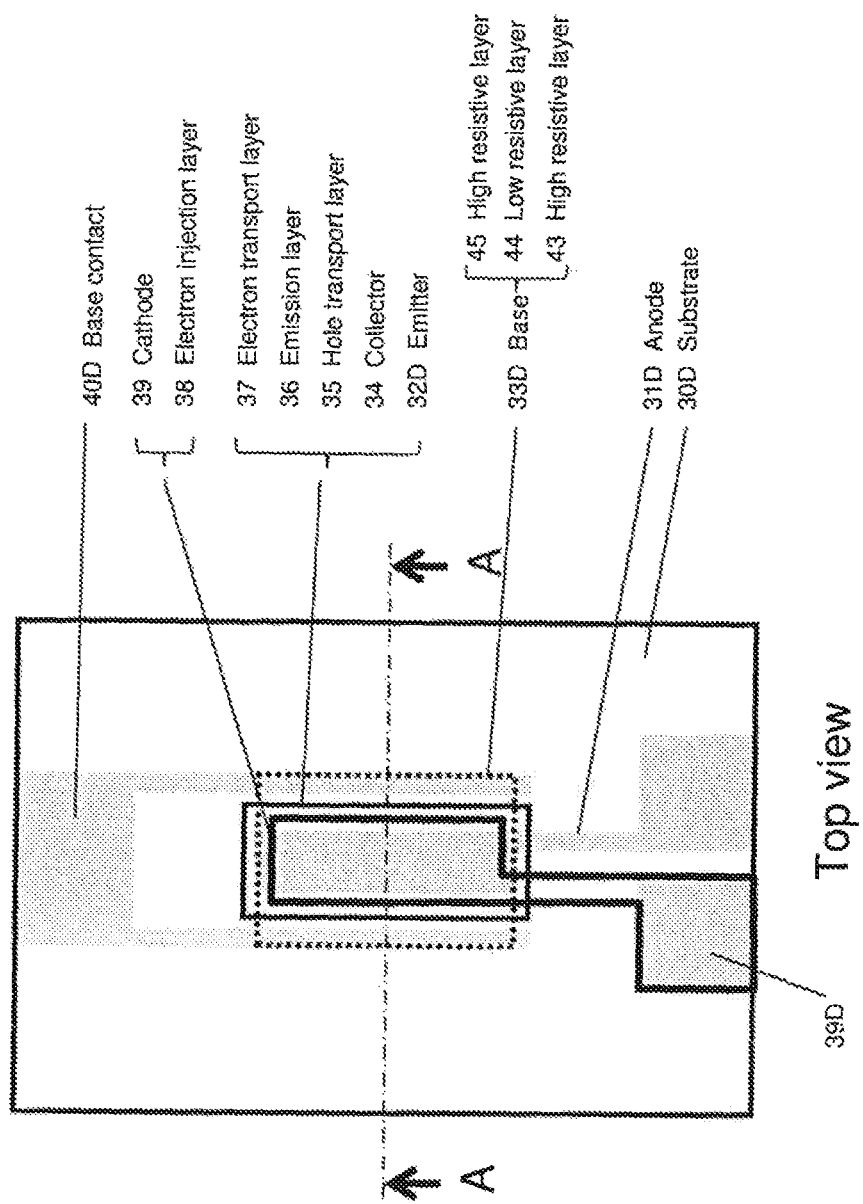

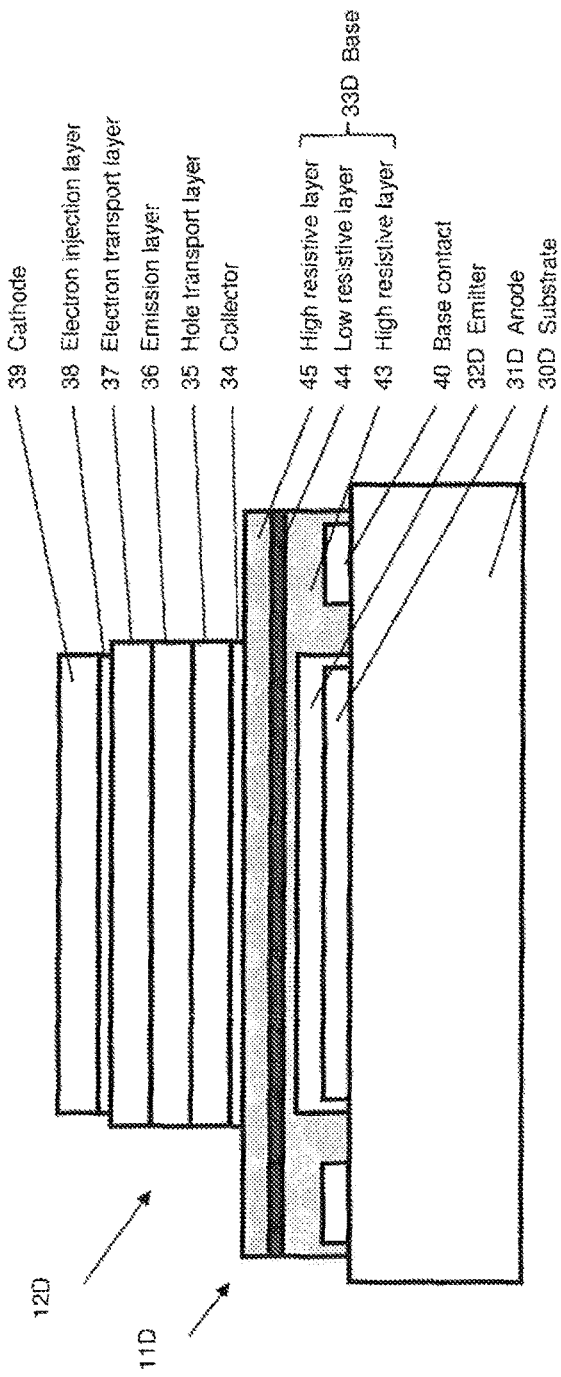

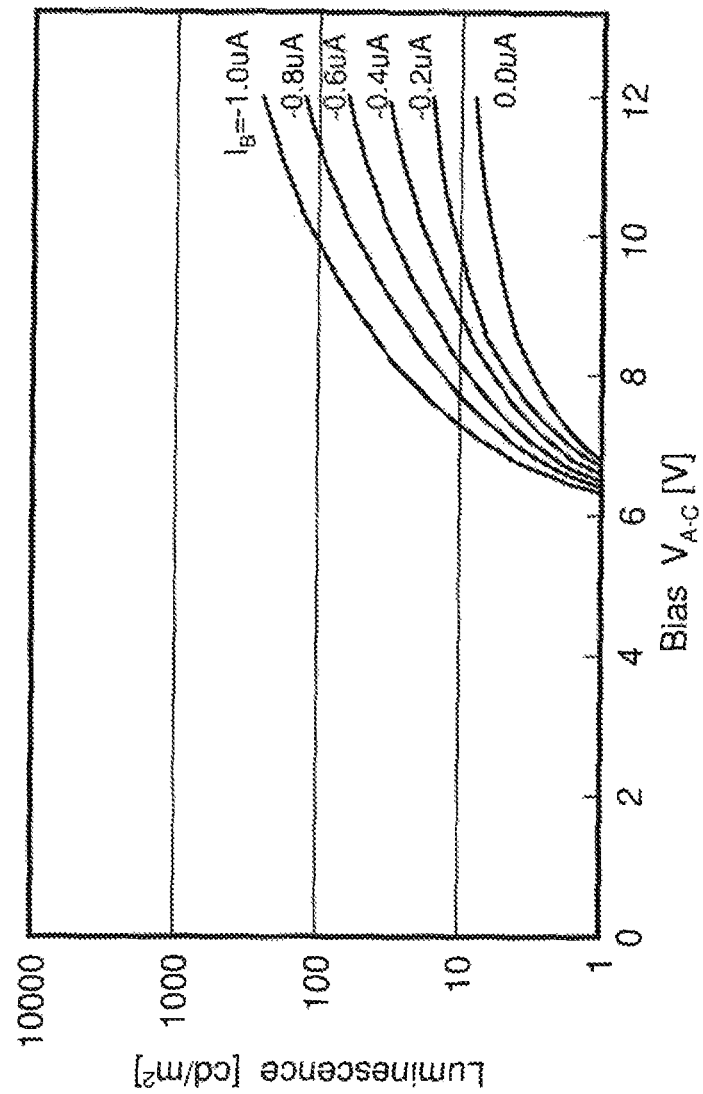

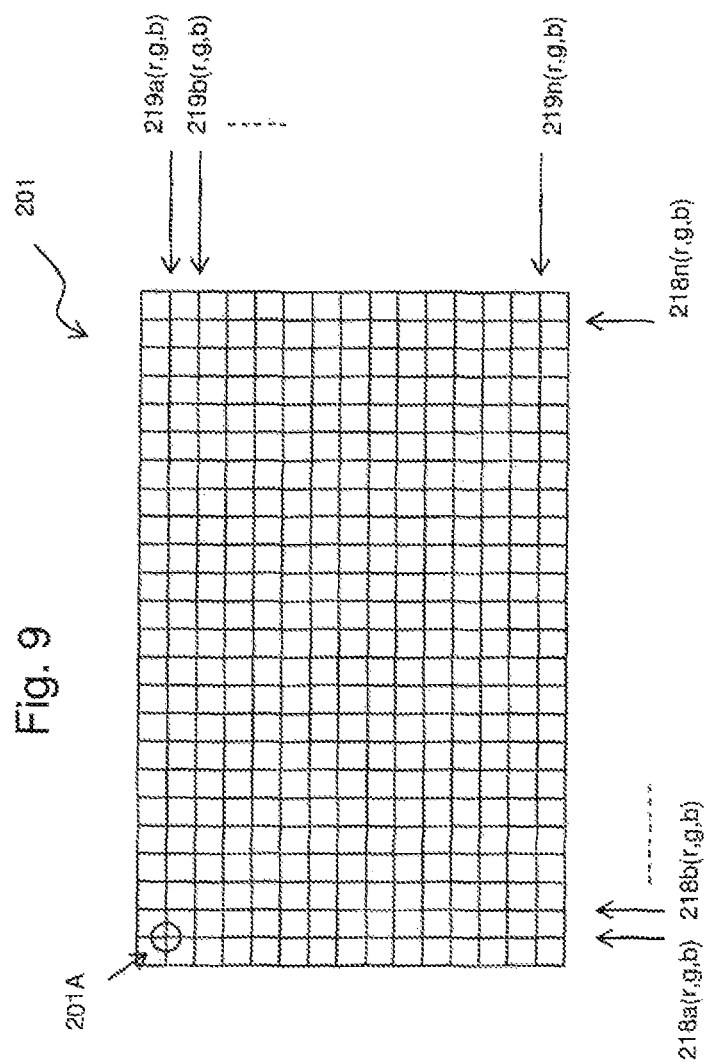

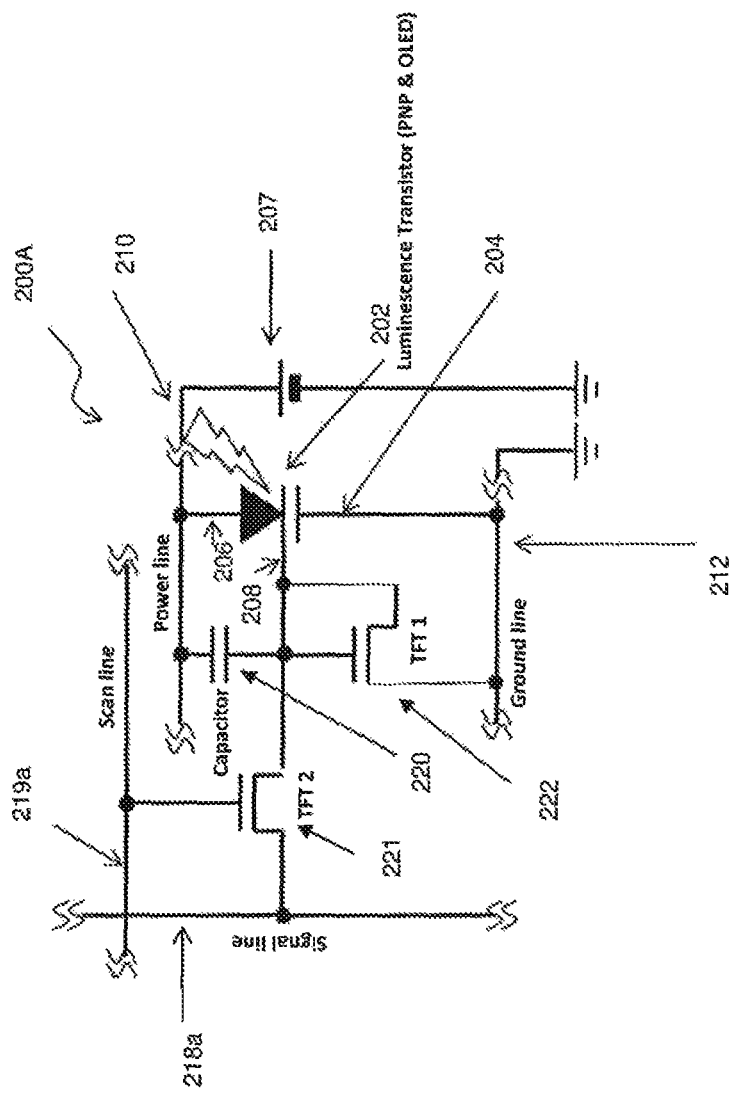

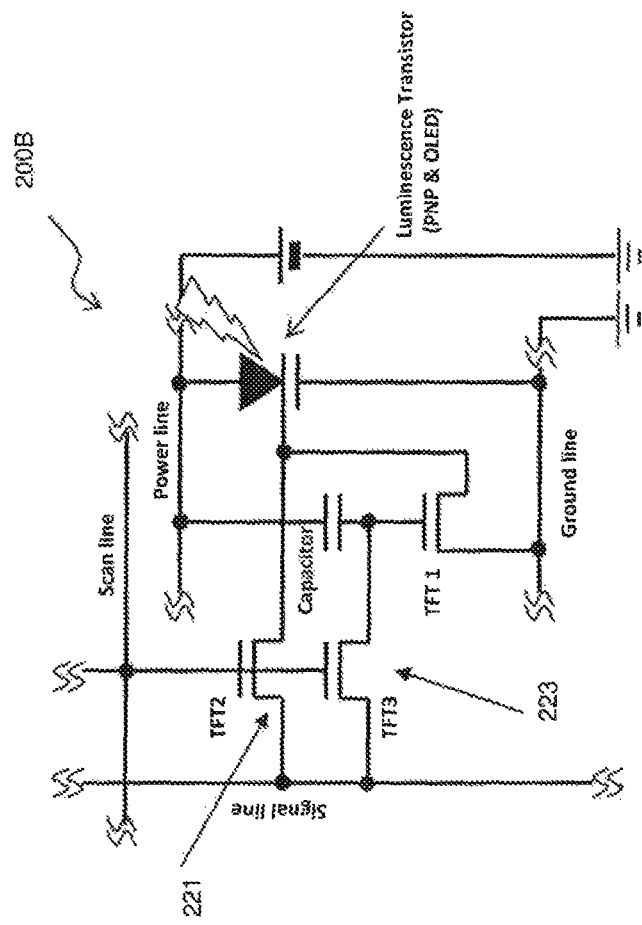

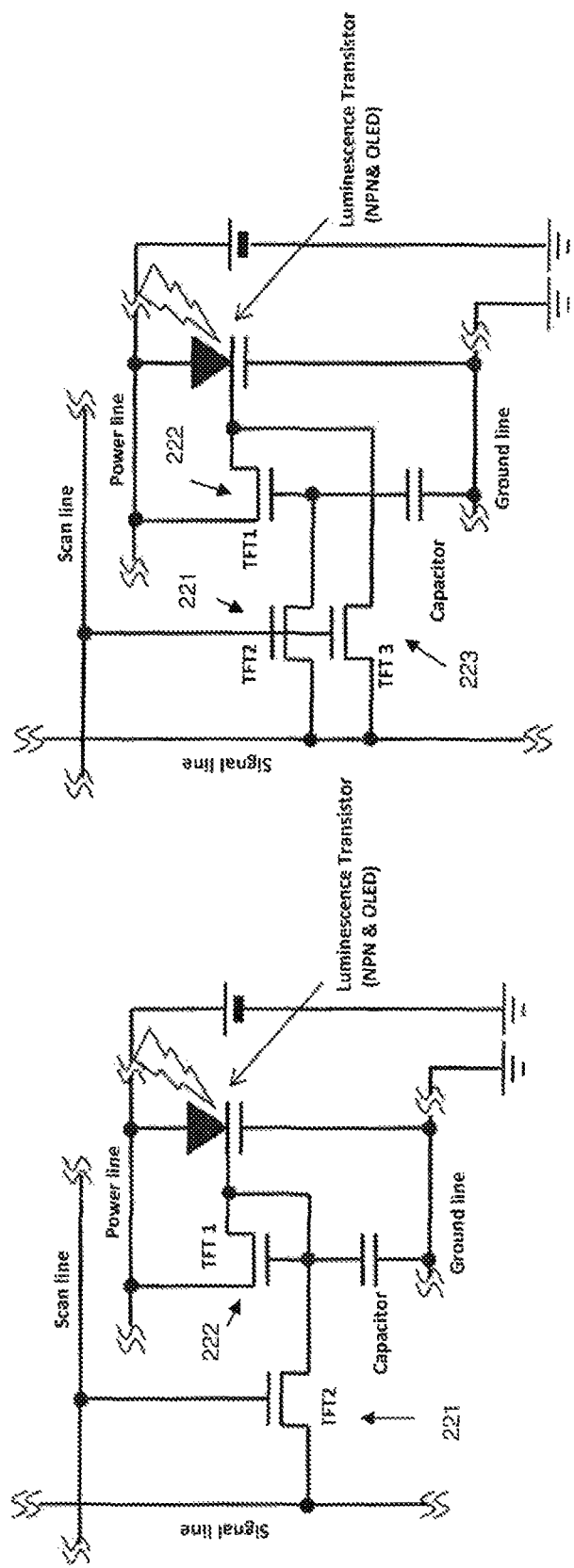

ns. Further, it is difficult to separate the luminescence transistor manufacturing process and the backplane manufacturing process.

A fourth proposed solution is to provide a luminescence transistor that operates based on function as a junction transistor, as opposed to a TFT, which is a field effect transistor. By integrating junction transistor functions and organic EL functions, load on the drive transistor is reduced compared with using a TFT drive transistor.

A luminescence transistor based on a junction transistor function may be more realistic than a TFT function because unlike a TFT, a junction transistor does not confine current to a narrow channel. Consequently, junction transistor technology can create a pixel having a greater luminescence area than in the case of TFT. Such technology is disclosed in JP2005-293980, JP2006-269323, JP2007-200788, JP2009-272442, and JP2010-135809. Disclosed amongst these documents is a current control base electrode disposed in a middle portion of an organic semiconductor layer, in which the base electrode is a slit-like conductor, a planar conductor, or a conductor/semiconductor having a laminated structure. The disadvantage of these technologies is that a semiconductor layer having a current control base electrode disposed in the middle portion is difficult to manufacture.

This technology enables the use processes at lower temperatures (eg at or below 300° C.) than in some other technologies, for example in technologies requiring annealing. Such technology therefore has an advantage of allowing a separation between the luminescence transistor manufacturing process and the backplane manufacturing process.

However, the structure of having a conductor inserted into an organic semiconductor performs poorly as a junction transistor. Furthermore, the structure is unstable, and its instability becomes an impediment to volume production and to production of large panels.

It would be desirable to solve or at least ameliorate at least one of these problems of the prior art. Various embodiments of the invention may therefore provide a stable, inexpensive, and/or high-performance luminescence transistor or active matrix OLED display. Various embodiments may allow a separation between the luminescence transistor manufacturing process and the backplane manufacturing process, and/or reduce a current control load at the backplane.

Reference to any prior art in the specification is not, and should not be taken as, an acknowledgment or any form of suggestion that this prior art forms part of the common general knowledge in Australia or any other jurisdiction or that this prior art could reasonably be expected to be ascertained, understood and regarded as relevant by a person skilled in the art.

PIXEL MATRIX CIRCUIT

FIELD OF THE INVENTION

The present invention relates to light emitting devices, especially transistors which incorporate an organic electroluminescent (EL) element to form an organic light emitting diode (OLED) in the transistor, and methods of manufacturing such devices.

BACKGROUND OF THE INVENTION

Advances in OLED technology have in recent times resulted in an effort to manufacture and optimise display devices based on OLED technology. Despite recent progress in OLED technology, there is still a desire to improve the performance of OLED display devices, and the ease and cost of manufacturing such devices. Improving OLED technology will improve the competitiveness of OLED displays compared with inexpensive liquid crystal displays.

An exemplary OLED display panel having an active matrix structure comprises a matrix of pixel circuits. Each pixel circuit has an OLED device and backplane having matrix wiring and thin film transistors (TFTs) for switching and driving the OLED device.

Such a pixel circuit has difficulty delivering and controlling electric current passed through each OLED device. This is because each drive TFT is comprised of amorphous silicon (a-Si) which has low carrier mobility. The low carrier mobility prevents a small a-Si TFT from delivering a large drive current. Additionally, such an a-Si TFT suffers from great changes in characteristics when subjected to a continuous current application, making control of the drive current difficult.

Discussed below are several approaches which have been proposed to address these difficulties.

A first proposed solution is to use a polycrystalline silicon TFT for the drive TFT. This provides the drive TFT with higher carrier mobility. However, this technology necessitates crystallization annealing processes in order to obtain polycrystalline silicon, generally on a glass substrate. The crystallization annealing is typically conducted through laser heating to temperatures above 1000° C., and it suffers from the disadvantage of a lower throughput as well as lower yield, resulting in a significantly higher cost as compared with a-Si TFT.

A second proposed solution is to use amorphous oxide TFTs for the drive TFTs. This technology uses a non-crystalline semiconductor of metal oxide, such as an oxide of In or Zn, and accordingly has an advantage of eliminating the necessity for crystallization processes such as a laser annealing process. However, this technology also suffers from the disadvantage of significantly lower yield. The low yield is due to a need for approximately 5-micron rule micromachining. There is also a difficulty in using existing a-Si manufacturing lines to manufacture amorphous oxide TFTs.

A third proposed solution is to provide a luminescence transistor by giving the TFT a luminescence function, thereby reducing the number of transistors required in the pixel circuit. An example of such an attempt is disclosed in JP2002-246639 where the TFT has a luminescence signal visible as a narrow line on a surface. However, such a TFT suffers from having a narrow emission area. Narrow line emission has limited scope in applications involving display

SUMMARY OF THE INVENTION

In a first aspect of the present invention there is provided an electroluminescent device comprising: an organic electroluminescent element and a junction transistor having a first region, a second region, and an intermediate semiconducting region configured to control flow of charge between the first and second regions. At least two abutting regions consist essentially of one or more semiconducting inorganic metal compounds. Each region of the junction transistor and the electroluminescent element are successively stacked along a common direction.

Preferably, the electroluminescent device is a luminescence transistor. The luminescence transistor has preferably three electrodes, specifically a first electrode being connected to the intermediate region, a second electrode being connected to either the junction transistor or the electroluminescent element and a third electrode being connected to the other of the junction transistor or the electroluminescent element.

Positioning

Preferably, the intermediate semiconducting region is a base region, the first region is an emitter region and the second region is a collector region, the base region and at least one of the emitter region or collector region being abutting regions.

Preferably, the organic electroluminescent element is distinct from and, more preferably, abuts the junction transistor. However, in other embodiments, one or more layers (e.g. a conducting layer) may exist between, but electrically couple, the electroluminescent element and the junction transistor.

Preferably, the electroluminescent element and each region of the junction transistor are layers that overlie each other. For example, the regions and junction transistor may each be planar, with each lying in a different plane.

More preferably, the electroluminescent element and each region of the junction transistor are successively stacked along a vertical direction.

Materials

Preferably, the two abutting regions consist essentially of one or more semiconducting inorganic metal compounds selected from metal oxides, nitrides, sulphides or carbides.

Preferably, the intermediate semiconducting region and the first region are abutting regions consisting essentially of one or more semiconducting inorganic metal compounds selected from metal oxides, nitrides, sulphides or carbides and the second region comprises one or more charge transporting organic carrier materials or metals. In one embodiment, wherein the second region comprises one or more charge transporting organic carrier materials or metals having a work function <2.5 eV or >4.0 eV.

Alternatively, the intermediate semiconducting region and the second region are abutting regions consisting essentially of one or more semiconductor materials selected from metal oxides, nitrides, sulphides or carbides and the first region comprises one or more organic materials or metals. In one embodiment, the first region comprises one or more charge transporting organic carrier materials or metals having a work function <2.5 eV or >4.0 eV.

PNP, NPN, N-Type Only and P-Type Only Junction Transistors

Preferably, the intermediate and each of the first and second regions consists essentially of at least one semiconducting material. In one or more embodiments, back-to back p-n junctions are respectively created between the first region and the intermediate region and between the intermediate region and the second region, thereby forming a PNP junction transistor or an NPN junction transistor.

In other embodiments, the intermediate and each of the first and second regions are all formed from n-type or p-type semiconducting material. Addition of a high resistive (insulating) layer to the intermediate region creates a potential energy barrier to the flow of charge between the first and second regions. Adjusting the potential of the intermediate region enables the charge flow to be controlled.

In all cases, the intermediate semiconducting region is the base, and the first and second regions respectively form either (i) the emitter and collector, or (ii) the collector and emitter of the junction transistor.

In one embodiment, the intermediate, first and second regions consists essentially of one or more semiconductor materials selected from metal oxides, nitrides, sulphides or carbides.

Schottky Embodiments

In one embodiment, but a schottky diode or schottky junction is additionally included between the intermediate region and the first region and/or between the intermediate region and the second region.

Optionally, the intermediate region and only one of the first and second regions consist essentially of semiconducting material, and the other of the first and second regions consists essentially of at least one metal forming schottky junction with the intermediate region.

Intermediate Region/Base

Preferably, the intermediate semiconducting region consists essentially of one or more semiconducting inorganic metal compounds selected from Zn, Cu, Ru, Al, In, Ga, Sn or Ti oxides.

In one embodiment, the intermediate semiconducting region has a structure of stacked laminae comprised of two or more layers of semiconductor materials, wherein the two or more layers include a high resistive layer and a low resistive layer.

In other embodiment, the intermediate semiconducting region consists of a structure where a high resistive layer and a conductive or low resistive layer are laminated to form two layers, thus forming an n-type only or a p-type only junction.

Collector/Emitter

Preferably, the first region consists essentially of one or more semiconductor materials selected from Zn, Cu, Ru, Al, In, Ga, Sn or Ti oxides.

Preferably, the second region consists essentially of one or more semiconductor materials selected from Zn, Cu, Ru, Al, In, Ga, Sn or Ti oxides.

Light Emission/Transmission

Preferably, the junction transistor is transparent. Preferably, light transmitted though the electroluminescent device is at least 30% of light incident, ie for externally generated light that is incident on the electroluminescent device, at least 30% of that light is transmitted through the device, giving the device a transmittance of at least 30%.

Light Emission from the Electroluminescent Element

Preferably, the electroluminescent device is configured such that light is generated from an organic light emission layer within the electroluminescent element, wherein the light emission layer is located between the junction transistor and further layers of the electroluminescent element.

In one embodiment, the further layers include a hole transport layer and/or an electron transport layer. Preferably, the electroluminescent element further includes a hole injection layer or an electron injection layer.

It is appreciated that the electroluminescent element, is referred to as being "organic" due to the organic light emission layer, but the element can nonetheless include inorganic layers. For example, it may include an inorganic electron injection layer, such as LiF. Preferably, the electroluminescent element is or includes an organic light emitting diode. However, in other embodiments, the organic electroluminescent element forms only part of an organic light emitting diode, with the other part of the organic light emitting diode being provided by the junction transistor, eg the collector of the junction transistor.

Top or Bottom Emission

Optionally, light generated from the light emission layer is transmitted through the junction transistor and is reflected by one or more of the further layers of the organic electroluminescent element.

Alternatively, light generated from the light emission layer is transmitted through the further layers of the organic electroluminescent element and is reflected by a reflector region located between the junction transistor and a substrate.

Top and Bottom Emission

Alternatively, light generated from the light emission layer is transmitted through the junction transistor as well as the further layers of the organic electroluminescent element.

Active Matrix Pixel Circuit

In a second aspect of the present invention, there is provided a pixel circuit comprising an electroluminescent device, according to the first aspect of the present invention, connected to a control circuit for controlling operation of the electroluminescent device, wherein the control circuit comprises: a switching means; a current setting transistor; and a capacitor.

Preferably, the switching means is configured to selectively couple a first control line and to an input electrode of the electroluminescent device for setting a voltage at the input electrode when the switching means is on; the current setting transistor is configured to deliver into or draw current out of the electroluminescent device, via said input electrode, when the current setting transistor is in a biased state; and the capacitor is configured to prolong the current setting transistor in the biased state when the switching means is turned off so as to prolong said delivered or drawn current.

In embodiments where the junction transistor is an NPN transistor the current setting transistor is configured to deliver current into the electroluminescent device, whereas in the cases where the junction transistor is a PNP transistor, the current setting transistor draws current out of the electroluminescent device.

Preferably, the switching means is a thin film transistor (TFT) having a gate connected to a second control line and source and drain configured for said coupling of the first control line to the input electrode.

Preferably, the current setting transistor is a TFT having a gate connected to the capacitor.

Preferably, the switching means additionally selectively couples the first control line to configure the current setting transistor in a biased state when the switching means is on.

In one embodiment, a second switching means selectively couples the first control line to set the voltage at the input electrode when the switching means is on, wherein the capacitor is isolated from the input electrode.

Passive Matrix Pixel Circuit

In a third aspect of the present invention, there is provided a pixel circuit comprising an electroluminescent device according to the present invention connected to a matrix circuit for controlling operation of the electroluminescent device, wherein the pixel circuit comprises: a first control line coupled to an input electrode of the electroluminescent device for setting a voltage at the input electrode; and a second control line connected to the electroluminescent device for applying a voltage between an anode and cathode of the device;
wherein the first and second control lines are synchronised such that the first control line provides a pulse that controls luminescence emitted from the electroluminescent device.

Preferably, a pixel matrix circuit comprises a plurality of said pixel circuits, wherein each electroluminescent device, wherein the second control lines of each pixel circuit are connected to a scan controller and the first control lines of each pixel circuit are also connected to a signal controller.

Preferably, a multiplexing drive for a pixel matrix circuit as described above, comprises the signal controller and scan controller configured to independently control each pixel circuit.

In a fourth aspect of the present invention, there is provided a multiplexing drive comprising: at least two of said pixel circuits according to the third aspect of the present invention, wherein the signal controller and scan controller of each circuit is arranged to operate independently.

Back Plane

In a fifth aspect of the present invention, there is provided an electroluminescent display panel comprising: a front plane and a back plane, the front plane including at least an electroluminescent device according to the present invention, and the back plane including at least a control circuit including at least two TFTs and at least one capacitor.

Preferably, the TFTs are chosen from polycrystalline Si TFT, amorphous Si TFT, oxide TFT or organic TFT.

Preferably, the at least two TFTs and the at least one capacitor are configured to form a pixel circuit in accordance with the third aspect of the present invention.

Method of Manufacture

In a sixth aspect of the present invention, there is provided a method for manufacturing an electroluminescent device in accordance with the present invention, wherein the method includes:

a) depositing the layers consisting of one or more semiconducting inorganic metal compounds by sputtering; and thereafter b) depositing the electroluminescent element by vacuum deposition.

In a seventh aspect of the present invention there is provided a method of manufacturing an electroluminescent display panel in accordance with the present invention, wherein the backplane is manufactured by at least a process of a first type and manufacturing the front plane includes a process of a second type that is different to the first process.

Preferably, the first type of process is performed at a temperature between 250-350 degrees C., and the second type of process is performed at a substrate temperature below 200 degrees C. Preferably, the substrate temperature is between room temperature and 100 degrees C.

Preferably, the second type of process is used to depositing one or more organic layers on, including at least the electroluminescent element, on the layers consisting of one or more semiconducting inorganic metal.

Preferably, in the method according to the seventh aspect of the invention, the electroluminescent device is manufactured by a method in accordance with the sixth aspect of the invention.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

FIG. 3 is a diagrammatic view of another embodiment of an electroluminescence transistor comprising an NPN junction transistor;

FIG. 3A is a diagrammatic view of another embodiment of a PNP electroluminescence transistor in accordance with FIG. 1 or 2, configured for bottom emission;

FIG. 3B is a diagrammatic view of another embodiment of a PNP electroluminescence transistor in accordance with FIG. 1 or 2, configured for top and bottom emission;

FIG. 4 is a diagrammatic view of another embodiment of a PNP electroluminescence transistor as in FIG. 1 or 2, but having a reflector and being configured for top emission;

FIG. 5 is a diagrammatic view of an embodiment of an electroluminescence transistor comprising a NPN junction in accordance with FIG. 3, configured for top emission; FIG. 6A shows a top view of an exemplary fabrication of a junction transistor in accordance with the present invention;

FIG. 8A shows a top view of an exemplary fabrication of a luminescence transistor in accordance with the present invention;

FIG. 8B shows a cross-sectional view of section A-A through the luminescence transistor of FIG. 8A;

FIG. 8C illustrates experimentally derived luminescence vs bias voltage curves illustrating luminescence characteristics of the luminescence transistor of FIG. 8A;

FIG. 9 shows an display panel having a grid of pixels driving electroluminescence transistors that are in accordance with the present invention;

FIG. 10A shows an example of pixel circuit for driving a PNP electroluminescence transistor in accordance with an embodiment of the present invention;

FIG. 10B shows another example of pixel circuit for driving a PNP electroluminescence transistor in accordance with an embodiment of the present invention;

FIG. 10C shows an example of pixel circuit for driving an NPN electroluminescence transistor in accordance with an embodiment of the present invention;

FIG. 10D shows another example of pixel circuit for driving an NPN electroluminescence transistor in accordance with an embodiment of the present invention;

DETAILED DESCRIPTION OF THE EMBODIMENTS

Figure 1:
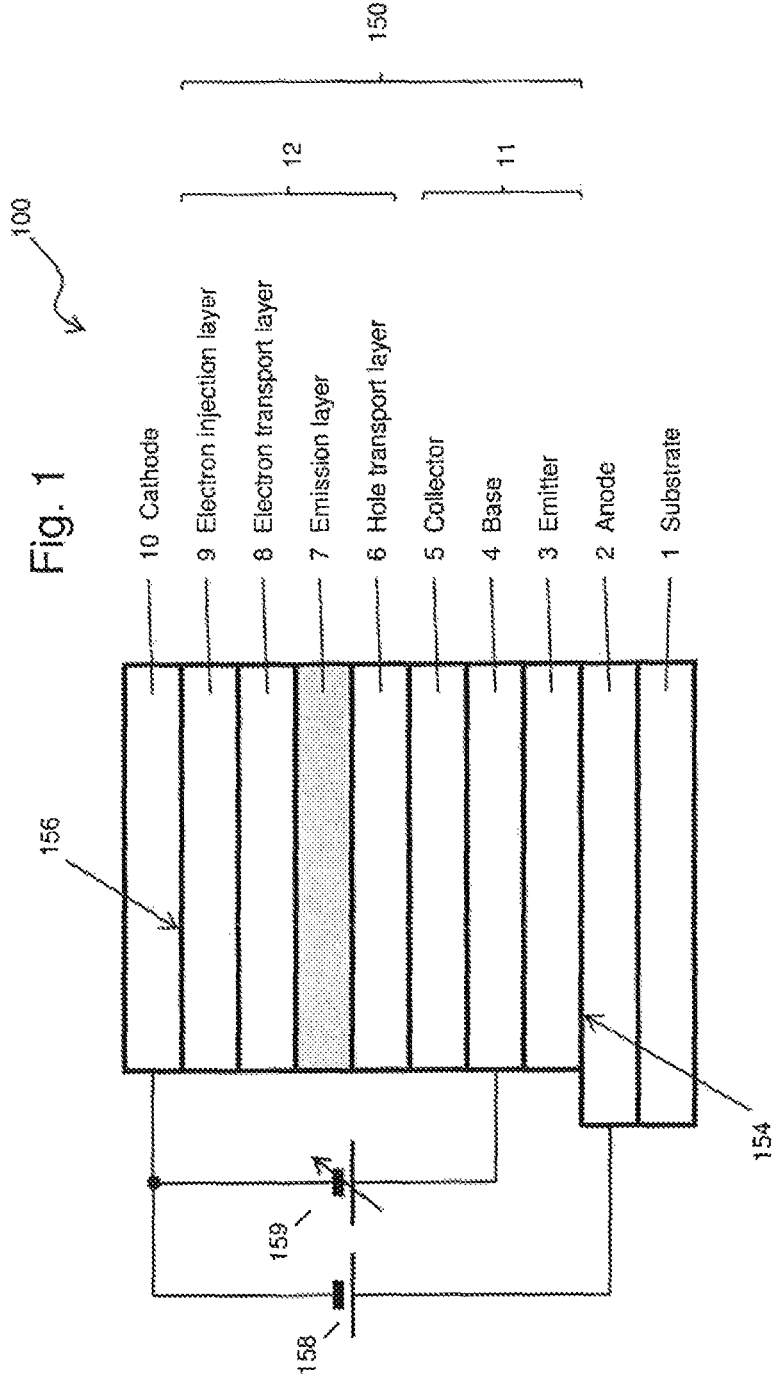
FIG. 1 is a diagrammatic view of an embodiment of an electroluminescence transistor comprising a PNP junction transistor.

An exemplary embodiment of an electroluminescent device according to the present invention is illustrated, schematically, FIG. 1. Electroluminescent device in the form of electroluminescence transistor 100 consists of an electroluminescent (EL) element 12 stacked on a junction transistor 11 to form a structure of stacked laminae or layers (referred to herein as "laminated structure" 150). The laminated structure 150 sits flush upon substrate 1, with each layer being substantially flat and overlying each other. Each layer is stacked successively on the preceding layer, so that each layer progresses the stack along a common direction that is generally orthogonal to a plane in which the preceding layer lies and to the plane in which the substrate lies. Such a configuration results is referred to as 'vertical' configuration because during manufacturing the substrate lies in the horizontal plane.

The junction transistor 11 is comprised of a base 4 is sandwiched between an emitter 3 and collector 5 to form a stack of semiconductors. In various embodiments described herein, the junction transistor 11 may have a PNP, NPN, n-type only or p-type only configuration. "P" refers to a p-type semiconductor in which a hole functions as a primary carrier, while "N" refers to an n-type semiconductor in which an electron functions as a primary carrier. A junction structure in which these are alternately joined to one another so as to form three layers are referred to as "PNP" or "NPN".

PNP Version

In the embodiment of FIG. 1, the emitter 3, base 4, and collector 5, are respectively p-type, n-type, and p-type semiconductors, thus forming a PNP junction.

The EL element 12 includes a hole transport layer 6, which sits on and makes a low barrier height contact with the collector 5 of the of the junction transistor 11. The EL element 12 has additional layers that are successively stacked upon one another. The layers are, in order, from one end of the stack to the other, the hole transport layer 6, an emission layer 7, an electron transport layer 8, and an electron injection layer 9.

The outer ends of the laminated structure 150, illustrated in FIG. 1 as bottom end 154 and top end 156 of the laminated structure 150, respectively, are each in contact with electrodes 2, 10.

The electrodes 2 and 10 provide the laminated structure 150 with electrical contacts to allow a voltage 158 to be applied across structure 150. A current flows through each of the layers 3-9 when a second voltage 159 is applied to bias the base such that the base emitter junction is forward biased. In the case of the PNP electroluminescence transistor 100 of FIG. 1, in normal use, electric current (in terms of a notional positive charge), flows into the emitter 3 and out of the electron injection layer 9, the electrode in contact with the emitter 3 acts as an anode, and the electrode 10 in contact with electron injection layer 9 acts as a cathode. Current is also drawn from the base 4, but the current is small compared with the current flowing from the anode 2 to the cathode 10. However, in the case of an NPN transistor current travels in an opposite direction to the PNP transistor.

At least two abutting semiconductor layers of the junction transistor 11 consist or consist essentially of one or more semiconducting inorganic metal compounds, such as metal oxides. For example the base 4 and the emitter 3 can consist or consists essentially of one or more semiconducting inorganic metal compounds, such as metal oxides. Thus in one embodiment, of semiconductor layers 3, 4, 5 constituting the junction transistor element 11, most of the number of the layers and, generally, most of the volume of the junction transistor consists of inorganic material in the form of various metal oxides. Optionally, all of the semiconductor layers 3, 4, 5 of transistor element 11 and, as a further option, the electrode in contact with the transistor element 11 (ie anode 2, in the case of FIG. 1) may be comprised inorganic material. In one embodiment, each of the semiconductor layers 3, 4, 5 are a metal oxide.

In order to control the voltage of the base 4, the base 4 needs to be (or include a layer that is) of low resistance, ie good conductivity (generally less than 100 kΩ/sheet). However, the conductivity of the base 4 tends to be adversely affected if the collector 5 is a metal oxide semiconductor. Therefore, it is advantageous for the collector 5 is in this embodiment consists of organic material, instead of an oxide semiconductor or other inorganic semiconductor. This organic material is also advantageously in contact with the EL element 12. One organic semiconductor that is suitable for the collector 5 is TcTa. Other suitable organic semiconductors include NPD, TAPC, PDA, TPD and m-MTDATA.

Figure 2:
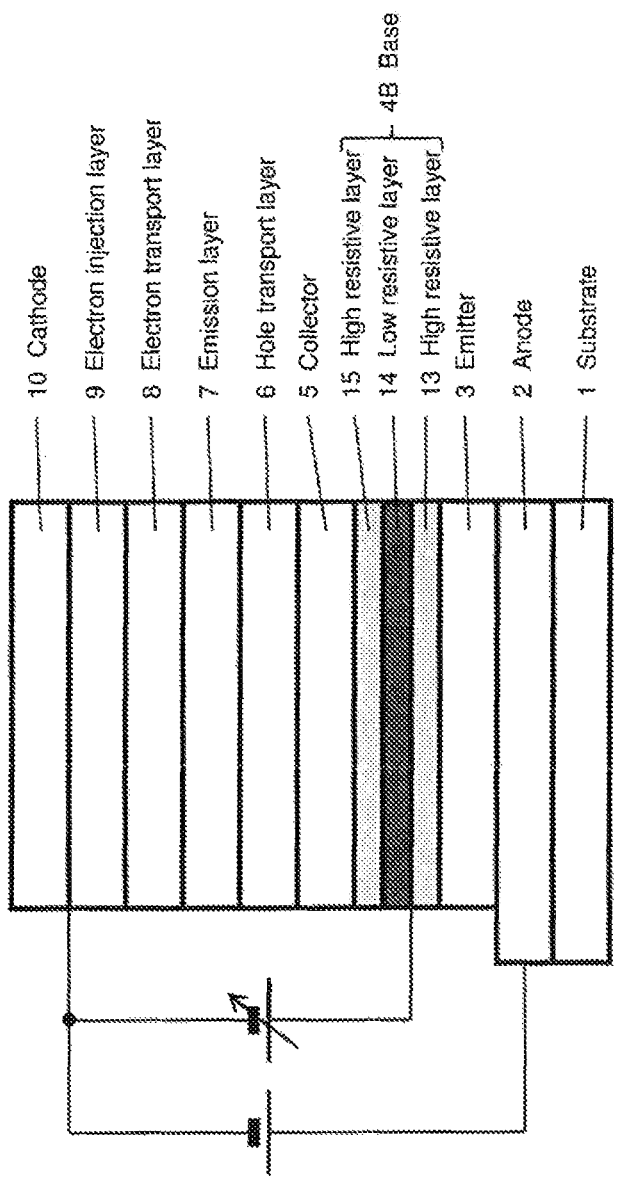
FIG. 2 is a diagrammatic view of an embodiment of an electroluminescence transistor the same as in FIG. 1, but having a base comprised of multiple layers.

In another embodiment, illustrated in FIG. 2, the base layer 4 of the junction transistor 11 consists of a structure where a low resistive layer (generally less than 100 kΩ/sheet) and at least one high resistive layer (generally greater than 1MΩ/sheet) are laminated to form two or more layers. More specifically, the base 4B consists of three layers, in which a low resistive layer 14 is sandwiched between high resistive layer 13, in contact with emitter 3, and a high resistive layer 15, in contact with collector 5.

The base layer is typically thinner than the emitter or collector, requiring interface control with the emitter or collector and at the same time proper conductivity. For this reason, a structure in which the low resistive layer and high resistive layer are laminated to form two or more layers is an effective option.

Base layer 4, and each layers of the base 4B, contain at least one of Ga, Zn, Cu, Ru, Al, In, and Ti metal oxides. The use of metal oxide chosen from these metals and its manufacturing conditions allow energy levels, carrier density, and P type/N type to be controlled. For example, in the embodiment in FIG. 1, the base layer 4 uses a metal oxidized film (N type) obtained by doping ZnO with In to produce a transparent amorphous oxide semiconductor TAOS. An alternative suitable TAOS material is ZnO with In and Ga (IGZO). Other suitable TAOS materials include IZO, IGO and InO.

Since junction transistor 11 is a PNP type transistor, as would be understood by a person skilled in the art, a small portion of the current that enters the emitter 3 will exit the base 4, rather than the collector 5.

NPN Version

In an alternative embodiment, illustrated in FIG. 3, the junction transistor 11B is an NPN type transistor, so in that in normal use, flows from the collector to emitter, with a small proportion of the total emitter current comprising a current component that flows into the base and out of the emitter. In this embodiment, the electroluminescence transistor 100B is a reciprocal the device in FIG. 1, as the electric current is configured to flow in the opposite direction to that illustrated in FIG. 1 and FIG. 2. For electroluminescence transistor 100B, the bottom face 153 of cathode 10 abuts substrate 1, and a top face 155 of cathode 10 is forms a low resistance contact with the bottom side 154 of the laminated structure 150B. Anode 2 forms a low resistance contact with the top side 156 of the laminated structure 150B. The layers 6-8 of the EL element 12B can be comprised of the same materials as layer 6-8 of EL element 12, but with the layers being positioned in the an opposite order. The layers from the anode 2 to collector 5B are therefore, successively, hole transport layer 6, emission layer 7 and electron transport layer 8. In this embodiment, the anode 2 acts as the hole injection layer for the EL element 12B, and the collector 5B acts as the electron injection layer for the EL element 12B. The collector 5B, base 3B, and emitter 2B, are respectively N-type, P-type and N-type semiconductors, thus forming a NPN junction transistor element 11B. The junction transistor element 11B is mostly inorganic and the N and P semiconductors may be comprised of the same materials as described in relation to EL device 100. Specifically the N and P semiconductor materials are metal oxides as already described herein. For example the, the n-type emitter can be one or more metal oxides selected from Zn, Cu, Ru, Al, In, Ga, Sn or Ti oxides, and the p-type emitter can be one or more metal oxides selected from Zn, Cu, Ru, AL, In, Ga, Sn or Ti oxides. While collector 5B can also be a p-type metal oxide, as in the case of device 100, it is more advantageous for the collector 5B to be an organic semiconductor. Appropriate organic semiconductors for collector 5B include TmPyPB, BPhene, PBD, TAZ, BND, OXD and TPBi.

N-Type Only Version

Figure 17:
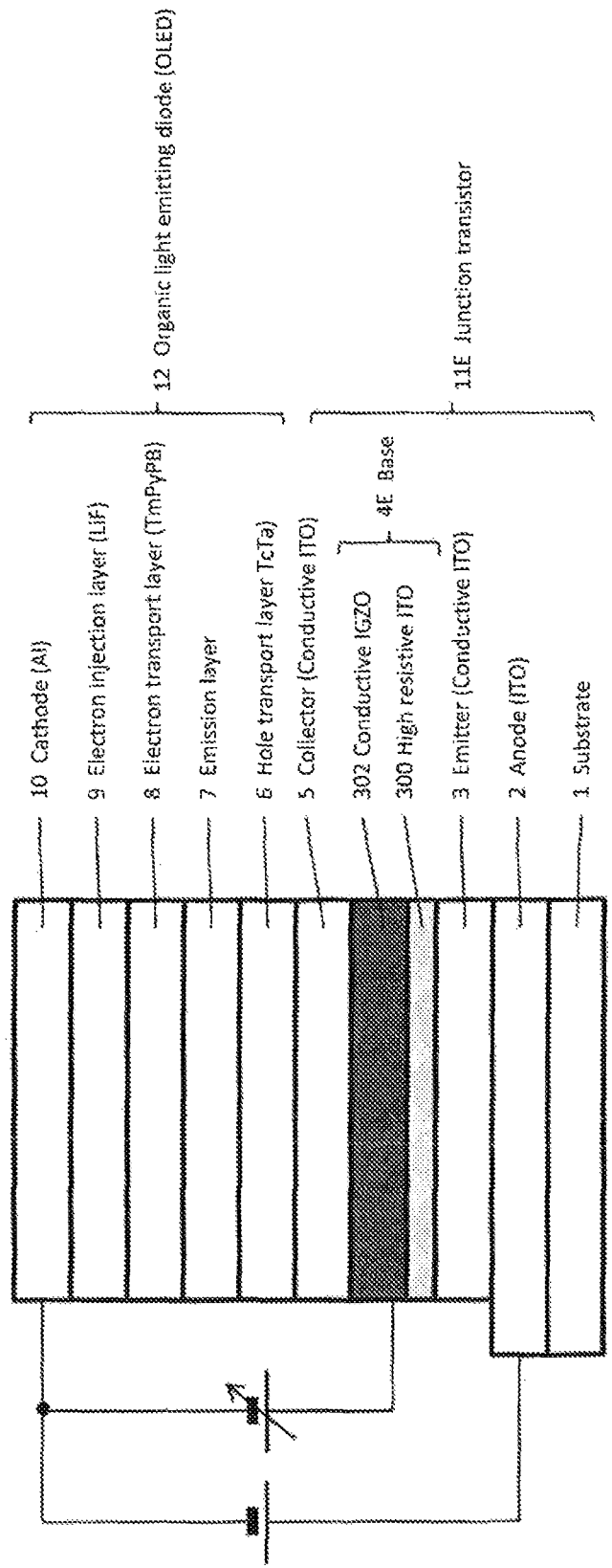
FIG. 17 is a diagrammatic view of another embodiment of an electroluminescence transistor comprising an N-type only junction transistor.

In an alternative embodiment, illustrated in FIG. 17, the junction transistor 11E is an N-type only transistor. The base 4E consists of a structure where a high resistive layer 300 (generally greater than 1MΩ/sheet) and a conductive or low resistive layer 302 (generally less than 100 kΩ/sheet) 302 laminated to form two layers, thus forming an N-type only junction.

A suitable material for use in the high resistive layer 300 is high resistive ITO, whereas a suitable material for use in the conductive layer is conductive IGZO. [WHAT OTHER MATERIALS ARE SUITABLE?]

In normal use, the high resistive (insulating) layer 300 creates a potential energy barrier to the flow of charge between the emitter 3 and collector 5. Adjusting the potential of the base 4E enables that energy barrier to be overcome and the charge flow to be controlled.

Figure 18:
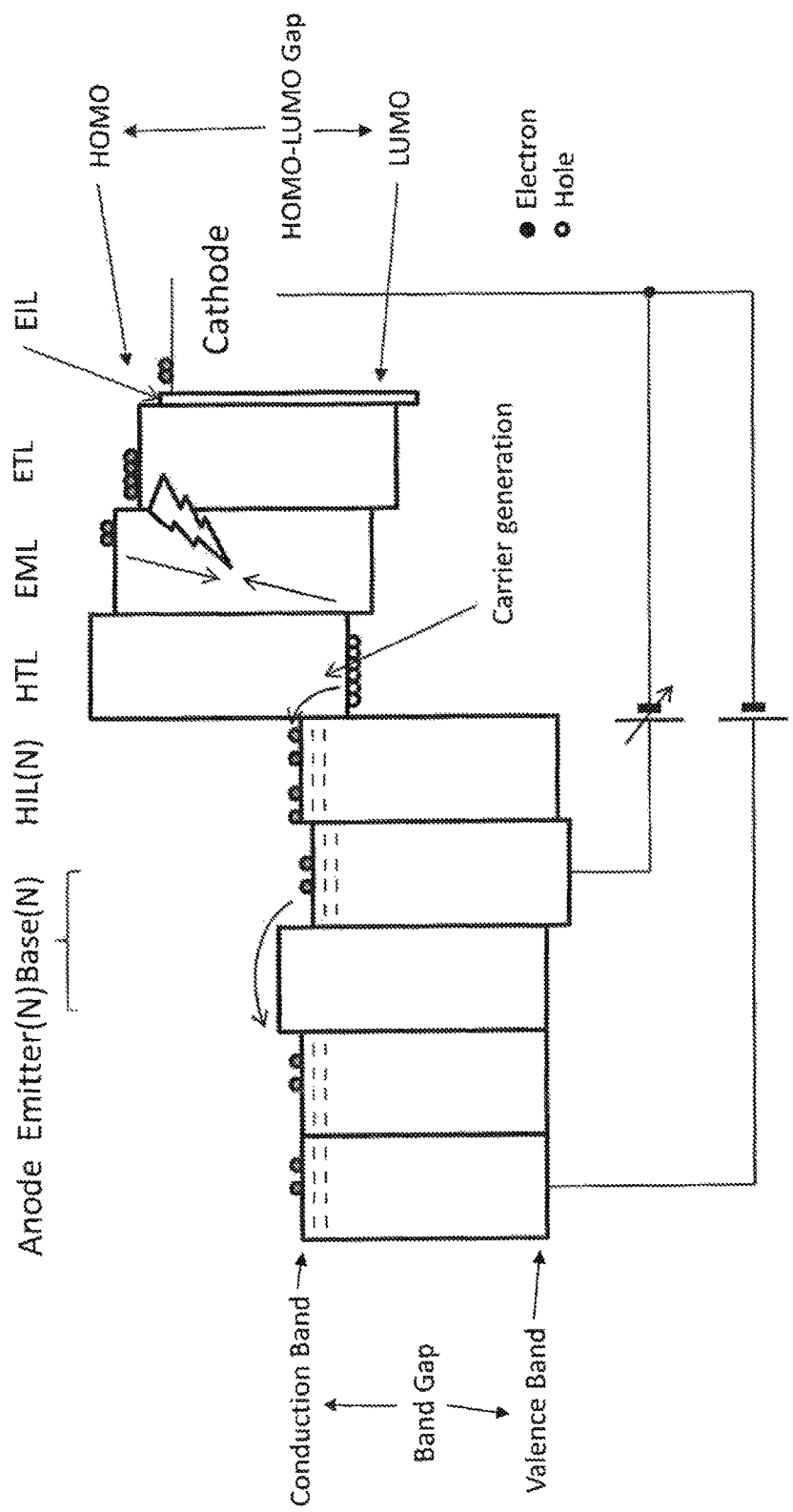
FIG. 18 is a schematic illustration of the semiconductor band structure of the electroluminescence transistor of FIG. 18.

By way of explanation, FIG. 18 depicts the semiconductor band structure of the electroluminescence transistor of FIG. 17. As shown in FIG. 18, electrons are transported in the highest occupied molecular orbit (HOMO) from the cathode 10, and other electrons are transported in the conduction band from the anode 2. Holes are generated at the PN junction of the interface of the hole transport layer (HTL) 6 and the hole injection layer (HIL) or collector 5. The holes and electrons from the cathode 10 recombine in the emission layer 7, resulting in the emission of light. The injected current can be regulated by controlling the potential of base electrode 4E.

The emitter may be formed from conductive ITO, InO, ZnO, IGZO, SnO. [WHAT OTHER MATERIALS ARE SUITABLE?]

P-Type Only Version

In an alternative embodiment (not shown), the junction transistor is a P-type only transistor, Once again, the base consists of a structure where a high resistive layer and a conductive or low resistive layer laminated to form two layers, thus forming an P-type only junction.

The emitter may be formed from conductive CuO, CuAlO [WHAT OTHER MATERIALS ARE SUITABLE?]

The Electrodes

For the NPN, PNP, n-type only and p-type only embodiments described herein, the electrodes 2, 10 are constructed of a material suitable for their roles interfacing with hole-injecting or electron-injecting semiconductors, or to provide the hole-injection (by the anode) or electron injection (by the cathode), at the bottom and top ends 154, 156 of laminated structure 150. The anode, being on the hole-injection end, in some embodiments contains at least one of Ga, Zn, Cu, In, Ti, and Si metal oxide semiconductors. The cathode, being at the electron injection end, in some embodiments contains at least one of Al, Li, Mg, K, Na, Ba, Sr, Ag, Ca and Cs metal or metallic compounds. The use of these materials allows barrier height to be controlled when holes or electrons are injected.

For one embodiment in accordance with FIG. 1, emitter 3 is an inorganic metal oxide semiconductor formed of $CuAlO_2$. The anode 2 attached to the emitter 3 is comprised of ITO (In, Sn oxide) or mainly ITO. At the electron injection end 156, Al metal (or mainly Al) is used for the cathode 10, and KF or LiF is used for an electron injection layer 9.

Light Emission Configurations

The Al cathode will reflect light generated from emission layer 7. However, in this embodiment, the substrate 1 is transparent to allow the generated light 160 to be emitted pass through it, as illustrated in FIG. 3A. To allow sufficient light transmission, substrate 1 has a light transmissibility of at least than 50 percent at light wavelength of 400 to 800 nm (ie covering the spectrum of visible light). The transistor element 11 is also transparent, and has a light transmissibility of at least 50 percent at light wavelength of 400 to 800 nm. Any light generated from the emission layer 7 of organic EL element 12 that is falls on cathode 10 is reflected by the cathode 10 and radiated through the glass substrate 1. Therefore the emitted light 160 is radiated mainly through the transparent substrate. This arrangement is referred to as a bottom emission configuration. Such a structure allows the manufacture of organic EL element 12 to occur after the fabrication of the junction transistor 11, thereby preventing the manufacturing processes of the junction transistor 11 from damaging the organic EL element 12.

In a variation of this embodiment, the cathode can be made of a transparent material, such as a metal oxide (eg ITO) having transmissibility of at least 50% for visible light, rather than a reflective metal. As illustrated for transistor 100C in FIG. 3B, this allows light to be emitted from both the top and opposite, bottom side of the transistor. Apart from the requirement of the cathode 10 being transparent, the other components of transistor 100C can be the same as transistor 100. For example transistor 100C can include, for example, LiF for the electron injection layer 9, TcTa for the Collector 5, ZnO—In for the Base 4, $CuAlO_2$ for the emitter 3, ITO for the anode 2, and glass for the substrate 1.

In yet other embodiments, the electroluminescence transistor can be configured to have light emitted only from the end of the electroluminescence transistor on the opposite end to the substrate (ie the top end), as illustrated in the embodiment illustrated in FIG. 4 (and FIG. 5). Such structures are referred to as top emission configurations.

FIG. 4 illustrates an embodiment of an electroluminescence transistor 100A having the same features as described in relation to electroluminescence transistor 100C of FIG. 3B, except that the substrate end of the device 100A is reflective rather than transparent, so that light is radiated mainly through transparent cathode 10. The reflectivity at the substrate side is provided by a chromium reflector 46 between the substrate 1 and anode 2.

Another embodiment of a top emission configuration is illustrated in FIG. 5 for an NPN luminescence transistor 100B consistent with FIG. 3. In this embodiment, a reflecting surface is provided on the transistor or substrate side of the EL element 12. However, in contrast with the embodiment in FIG. 4, luminescence transistor 100B does not require a separate reflector layer. Rather, the junction transistor electrode (cathode 10) in contact with the substrate is a reflective metal, such as aluminium. The anode 2 at the end opposite the substrate is a transparent material such as an a metal oxide semiconductor (eg ITO), thus allowing light to be emitted primarily from the top of the device 100B.

FABRICATION EXAMPLES

Example 1

Figure 6B:
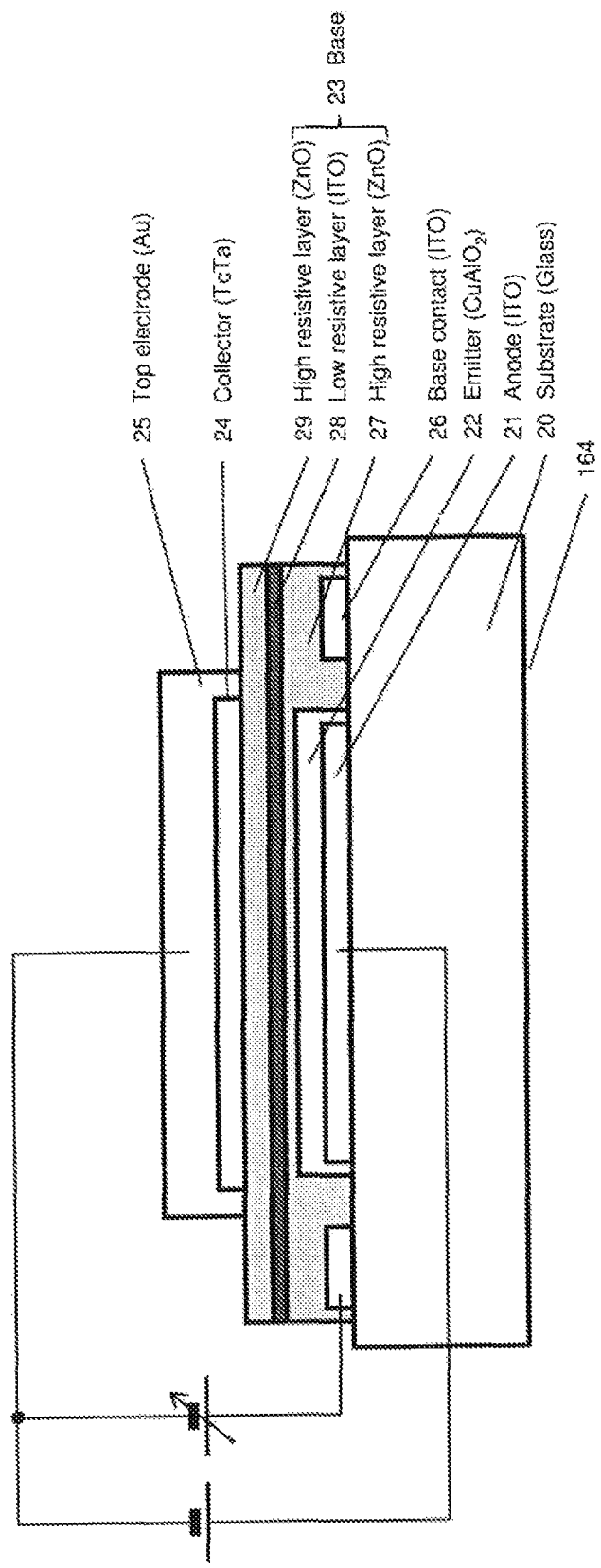
FIG. 6B shows a cross-sectional view of section A-A through the junction transistor of FIG. 6A.

FIG. 6A and FIG. 6B show a top view and a cross-sectional view, respectively, of an exemplary fabrication of junction type transistor 11C. The fabrication of the junction-type transistor 11C may be adapted to fabricate electroluminescence transistor 100 by providing EL element 12 and cathode 10, as described in relation to FIGS. 1-3, in place of top electrode 25.

Junction transistor 11C has an anode 21 of ITO having a film thickness of about 150 nm, and a base contact 26. The anode 21 and base contact 26 are formed on a glass substrate 20. Emitter 22 is a P-type $CuAlO_2$ film having a film thickness of about 80 nm, which is formed by sputtering on the anode 21. Due to the use of a stencil mask, the area of the film that comprises base 23 is limited in area, which limits current from straying laterally and also limits the luminescence region of the substrate 20 (ie, the region from which light is emitted from the bottom 164 of the substrate 20) to a middle portion of the substrate, ie the portion of the substrate 20 that is covered by base 23.

Base 23 is formed so as to cover the luminescence region and be in contact with the base contact 26. The base is a comprised of three n-type layers consisting of a lower resistive ITO layer 28 sandwiched between lower and upper high resistive ZnO layers, 27 and 29, respectively. Each of the ZnO layers 27, 29 have a film thickness of 15 nm, while the ITO layer 28 has a film thickness of 5 nm. The base layers 27-29 are formed by successively sputtering each layer, using a stencil mask. Changing the film thickness of the ITO layer 28 allows the conductivity of the base 23 to be adjusted.

Collector 24 is a P-type organic semiconductor film of TcTa, having a film thickness of about 25 nm. Collector 24 is vacuum-deposited on the base 23 using a stencil mask so as to cover the luminescence region.

Next, an top electrode 25 comprised of gold is vacuum-deposited. The film thickness of the top electrode 25 is about 100 nm.

Figure 7A:
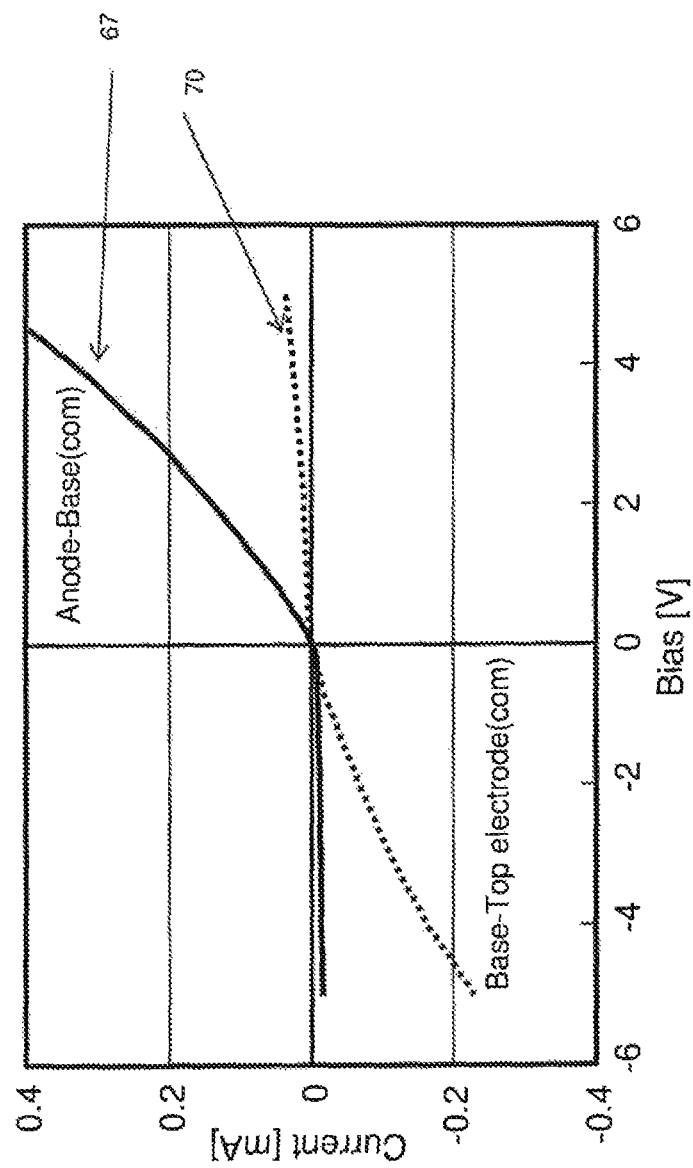
FIG. 7A illustrates experimentally derived current-voltage curves for the respective p-n junctions of the junction transistor of FIG. 6A.

This fabrication of junction transistor 11C has been evaluated for its characteristics. FIG. 7A shows current-voltage characteristics for the respective p-n junctions formed between the emitter 22 and base 23, and between the collector 24 and base 23. For the base-emitter p-n junction characteristics, a voltage $V_{EB}$ was applied from the emitter 22 to base 23 (ground), via the anode 21 and base contact 26 electrodes, respectively. The anode 21 and the base contact 26 the same voltage as the emitter 22 and base 23, respectively, due to low resistance contact between the electrodes 21, 26 and their respective semiconductors 22, 23. In FIG. 7A, $V_{EB}$ is indicated along the x-axis as bias voltage 66, measured in volts. The resulting current from emitter 22 to base 23, in milliamps, is indicated by curve 67, the y-axis indicating current 69 in milliamps. A voltage $V_{BC}$ is similarly applied from base 23 to collector 24 by applying voltage to base contact electrode 26 and top electrode 25. The resulting current from base 23 to collector 24 is indicated by curve 70.

Figure 7B:
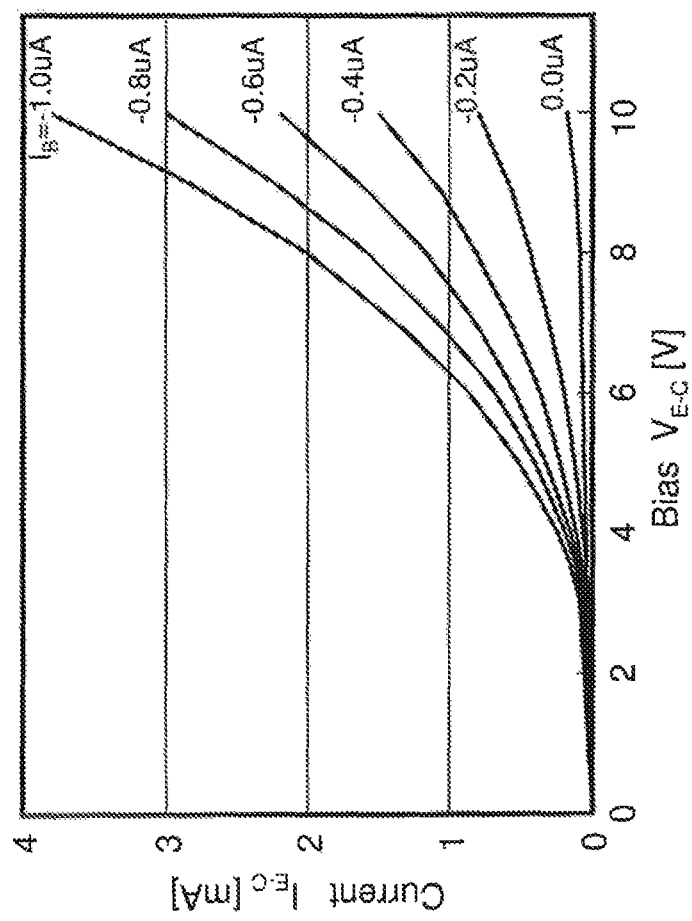
FIG. 7B illustrates experimentally derived current-voltage curves illustrating transistor characteristics of the junction transistor of FIG. 6A.

FIG. 7B illustrates the results of an experiment in which transistor characteristic curves were derived from operation of junction transistor 11C. The y-axis indicates current, in milliamps, from emitter 22 to collector 24 with respect to bias voltage from emitter 22 to 24 on the x axis. Characteristics curves are illustrated for six different base currents ranging from 0 to −1.0 μA, the negative base current indicating that current is leaving the transistor 11C out of base 23. The voltage $V_{EC}$ was applied to measure the dependence of a current $I_{EC}$ on base current $I_B$, showing that the current between the emitter 22 and collector 24 modulates, depending on the base current $I_B$.

Example 2

FIG. 8A and FIG. 8B show a top view and a cross-sectional view, respectively, of an exemplary fabrication of luminescence transistor 100D.

The substrate 30, anode 31, emitter 32, base contact 40 and base 33 are formed of the same materials, in the same quantities, and in the same manner as the corresponding substrate 20, anode 21, emitter 22, base contact 26 and base 23 of junction transistor 11C.

However, in contrast with the junction transistor 11C, the collector 34 is, in this example, an organic semiconductor in the form of HAT, having a film thickness of 2 nm. The HAT organic semiconductor of collector 34 is vacuum-deposited on base 33. The collector 34 of the junction transistor 11D also function as a hole injection layer for the EL element 12D.

A P-type organic semiconductor film consisting of TcTa and having a film thickness of about 25 nm is vacuum-deposited on the collector 34 to form a hole transport layer 35. Next, mCP and FIrpic are together vacuum deposited on the hole transport layer 35 to form emission layer 36, having a film thickness of about 40 nm. The mCP and FIrpic are deposited in volume proportions of about 94% and 6%, respectively Next, an electron transport layer 37 is provide by vacuum depositing TmPyPB, with a film thickness of about 20 nm, over layer 36.

Each of the collector 34, hole transport layer 35, emission layer 36 and electron transmission layer 37 are vacuum-deposited using a stencil mask so as to cover the luminescence region.

Next, an electron injection layer 38 consisting of LiF, with a film thickness of about 1 nm, and then cathode 39, consisting of Al having a film thickness of about 100 nm, are successively vacuum-deposited using a stencil mask so as to cover the luminescence region. The stencil mask is configured to allow the cathode 39 to be formed such that it extends beyond the luminescence region so to provide an outside electrode portion 39D (FIG. 8A).

The results of an experiment on luminescence transistor 100D, are shown in FIG. 8C, illustrating how increases in base current $I_B$ modulates an increase in luminescence bright brightness. The y-axis indicates luminescence in cd/m$^2$, and the x-axis indicates bias voltage $V_{AC}$ from the anode 30 to cathode 39, with the cathode 39 being grounded. FIG. 8C illustrates luminescence vs $V_{AC}$ for five values of base current $I_B$, ranging from 0 to −1 μA.

Active Matrix Display

FIG. 9 depicts an active matrix organic light emitting diode display (AMOLED) 201 comprised of a grid of pixels 201A. Each pixel includes three pixel circuits, described below, with each circuit having an electroluminescent element in accordance with the present invention (eg electroluminescence transistor 100), respectively configured to emit light in red, green and blue light. Each pixel circuit is addressed by a unique intersection of horizontal scan lines 219a(r, g, b) to 219n(r, g, b) and vertical signal lines 218a(r, g, b) to 218n(r, g, b). Each of the red, green and blue light pixel circuits could be considered sub-pixels of a single pixel. However, for convenience, no distinction is made hereinafter between pixels and sub-pixels—both are referred to as 'pixels'.

FIG. 10A is a schematic of a portion of an active matrix display, showing a pixel circuit 200A, in accordance with an aspect of the present invention.

Circuit 200A includes a luminescence transistor 202 such as luminescence transistor 100, or any other p-n-p type electroluminescent transistor in accordance with the present invention.

The luminescence transistor 202 has cathode 204 and an anode 206 through which current passes from the anode 206 to the cathode 204 (ignoring, for simplicity, a loss of current via the base current). The current passes between an emitter (at anode 206) and a collector of the junction transistor, and through the luminescent element to cathode 204. The anode 206 is electrically connected directly to power line 210, and the cathode 204 is electrically connected to ground line 212, so that a constant supply voltage $V_{AC}$ 207, is held on the anode with respect to the cathode, which is equal to the voltage of the power line with respect to the ground line.

The current through the luminescent element is a function of a base current $I_B$ into or out of base 208. For the pixel circuit illustrated in FIG. 10A, the junction transistor element of the luminescence transistor is a PNP-type junction transistor, when base current $I_B$ is out of the base 208 when the luminescence transistor is on. Since the junction transistor is a PNP-type, the luminescence transistor 202 will turn on when the voltage of base 208 is pulled low (toward the ground line 212), and will be off when the voltage of base 208 is pulled high (toward the power line 210).

A switching means in the form of a thin film transistor (TFT) 221 selectively couples a first control line in the form of signal line 218a(r, g or b) to the base 208, and is controlled by scan line 219a(r, g or b).

When the signal line 218a is low and the scan line 219a is high, TFT 221 is on, pulling the base voltage low drawing current though the base. The current through the base generates a voltage between the emitter and base, which is held by a capacitor. In FIGS. 10A and 10B, the capacitor 220 is connected between the base 208 and the power line 210. The voltage at the base will settle to a pre-determined steady-state level, determined by the voltage of the signal line, thereby resulting in a predetermined current through the electroluminescent element of the luminescence transistor 202. Thus results in the emission of light at a predetermined intensity or brightness. The precise current drawn from base 208 is largely determined by a current setting transistor 222 which has its gate and either its source of drain coupled to the base 208, which the other of the source or drain being connected to ground line 212. The current setting transistor 222 thus acts as a current source, pulling current from the base 208 to ground.

When the scan line 219a is pulled high, TFT 221 turns off. However, the capacitor 220 keeps the voltage that the gate of current setting transistor 222 is a biased state such that the same level of current continues to be pulled from base 208, and therefore the predetermined illumination level of the luminescence transistor 202.

As time passes, the capacitor 220 will gradually discharge due to the resistance between base 208 and the anode 206 of the luminescence transistor 202, connected across the capacitor 220.

Thus the base voltage will gradually increase until the electroluminescent transistor turns off on the current setting transistor is no longer draws current from the base 208.

However, the presence of the capacitor prolongs the on-time of the transistor 202, compared to the same circuit without the capacitor.

An alternative exemplary pixel circuit 200B (FIG. 10B) is the same as pixel circuit 200A, except that the switching transistor 221 that is connected to the base of the electroluminescent device is disconnected from the capacitor and current setting transistor. A second switching transistor 223 independently couples the signal line to the capacitor and the gate of the current setting transistor. In this manner, when the scan line goes high and switching transistors 221 and 223 turn off, the capacitor does holds its charge for much longer because it is isolated from the base of the luminescence transistor and has no other low resistance discharge path.

The configuration in FIG. 10B, can be summarised as providing a pixel configuration constituting a display that includes the luminescence transistor, at least two thin-film transistors, and at least one capacitor and holds the gate voltage of one of the thin-film transistors through the electric voltage generated by an electric current that is passed through the base of the luminescence transistor and thereby gives a predetermined brightness, wherein the source or gate electrode of the thin-film transistor is connected to the base layer of the luminescence transistor, and one terminal of the capacitor is connected to the gate electrode of the thin-film transistor, and the gate voltage of the thin-film transistor is determined by a voltage given from a signal line, and, at the same time, is held by electrical charge stored in the capacitor and, in addition, an electric current flowing through the base layer of the luminescence transistor is held, thereby setting a predetermined brightness.

In both of these configurations in FIGS. 10A and 10B, the gate voltage of current control transistor is set by an electric voltage that is generated between the base and the emitter of the luminescence transistor as a result of the current passed through the base of the luminescence transistor. The luminescence transistor can thereby be biased to give a predetermined brightness level.

With this arrangement, a predetermined brightness level is set in the luminescence transistor and held until a new brightness level is set by the voltage level of the signal line, at the next scan cycle.

This base current setting method has an advantage in the ability to provide highly reproducible light emission despite variation in electrical characteristics of the luminescence transistor. JP2008-171580 discloses a pixel circuit in which a luminescence transistor is driven by one or two TFTs, but in contrast with the pixel circuit in FIG. 10A, the pixel circuit cannot hold the gate voltage of the thin-film transistor through the electric voltage generated by an electric current that is passed through the base.

The above pixel circuits can be modified to operate on an n-p-n type luminescence transistor (eg luminescence transistor 100B), as illustrated in FIGS. 10C and 10D. The functions of each of the circuit components is the same as in FIGS. 10A and 10B, but with some variations in the topology. In the n-p-n case, the emitter of the luminescence transistor is on the ground line side of the circuit of the circuit, as opposed to the power line side in the p-n-p case. Thus the luminescence transistor turned on by pulling its base electrode high. Therefore, the positions of the capacitor and the current setting resistor are revered compared to the p-n-p case, such so in the n-p-n case the capacitor is connected between the base and ground and the current setting transistor is located between the base and the power line. The luminescence transistor is turned on when the signal and scan lines are high, driving current into the base. The luminescence transistor is off, when the scan line is low.

Figure 11:
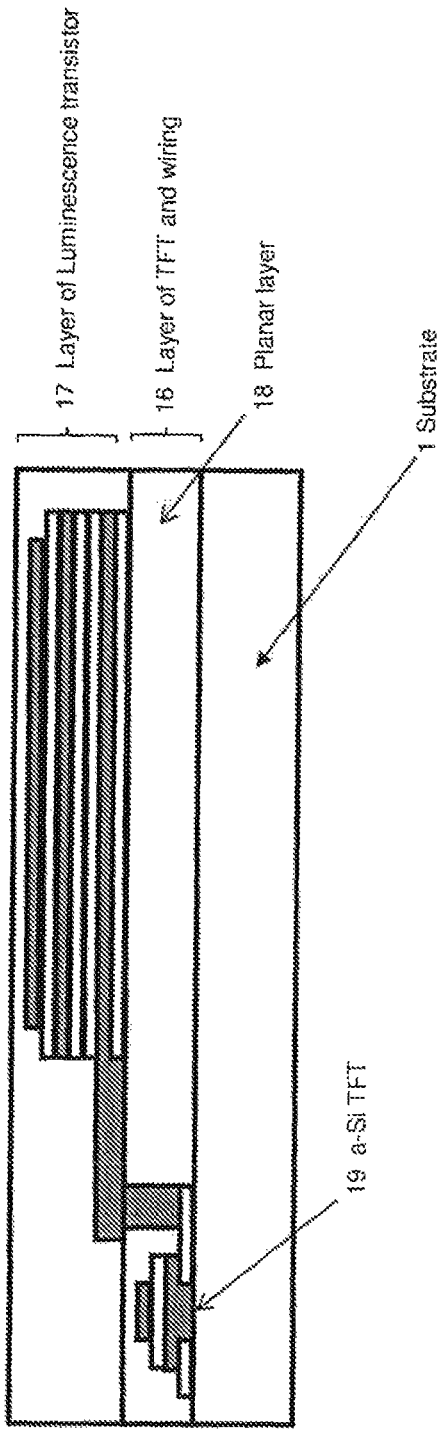
FIG. 11 shows a cross-sectional view through a portion of a display panel having a backplane and a front plane, the front plane having an electroluminescence transistor in accordance with the present invention mounted.

The pixel circuit of FIGS. 10A, 10B, 10C and 10D is formed such that the active capacitors, switching transistor (s) and current setting transistor are formed in a planarization layer 18 (FIG. 11) on a substrate 1. The substrate 1 can be transparent under visible light so that light can be transmitted through the substrate (eg a bottom emission configuration). This structure has an advantage of enabling a separation between the manufacturing process of a backplane layer 16 having the switching and current setting TFTs (only one TFT 19 is shown), the capacitor (not shown) and matrix wiring, and the manufacturing process of a separate layer 17 having the luminescence transistor. It is appreciated, however, that a more basic control circuit may be employed so that the backplane layer includes, for example only one TFT (ie switching transistor 221), as shown in FIG. 11, rather than the two or three transistors and a capacitor as in the pixel circuits of FIGS. 10A-10D.

In any case, the planarization of the backplane his is particularly beneficial because, the backplane can be manufactured using existing manufacturing facilities, so investment is only required to develop manufacturing facilities for the luminescence transistor itself.

In the present invention, a configuration having such a two-layer structure is particularly effective in pixel configuration in cases where the thin-film transistor includes an active layer consisting mainly of non-crystalline silicon or metal oxide. This is because technologies already established as mass production processes can be used. Accordingly, in the embodiment illustrated in FIG. 11, the thin-film transistor consists mainly of a-Si for its active layer. However, alternatively, poly crystalline silicon or organic semiconductor can be used for the thin-film transistor as its active layer. Similarly, the thin film transistors 221, 222 and 223 in FIGS. 10A, 10B, 10C and 10D are preferably a-Si type TFTs.

Figure 12:
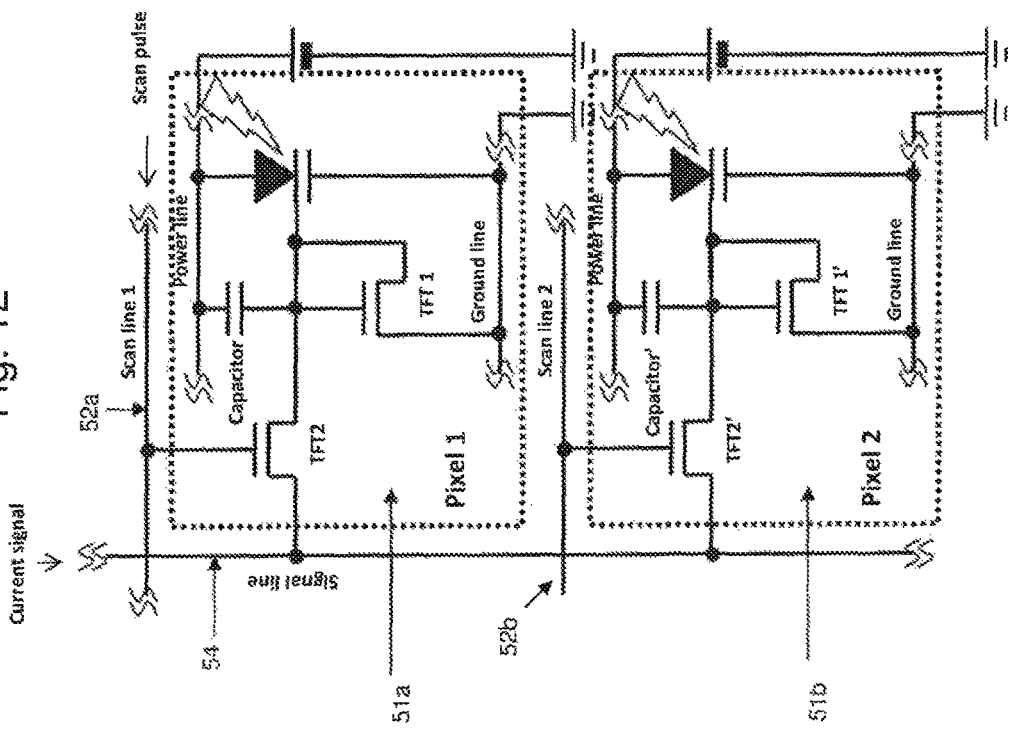
FIG. 12 illustrates a portion of an active matrix circuit having two pixel circuits, each pixel circuit being in accordance with FIG. 10A, and being connected to the same signal line and different scan lines.
Figure 13:
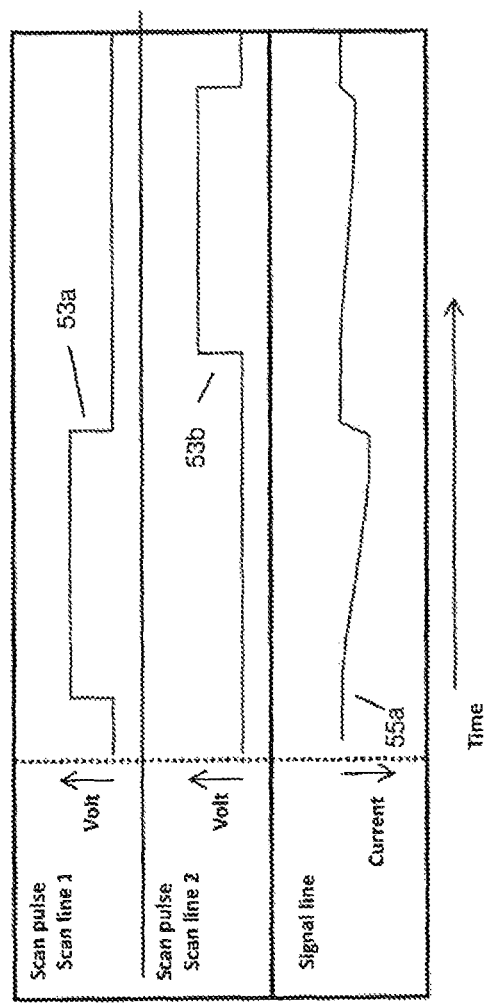
FIG. 13 illustrates, for the portion of the active matrix in FIG. 12, the current signal into the signal line when each of the signal lines are successively pulsed to turn on their respective electroluminescence transistors.

FIG. 12 shows two pixel circuits 51a, 51b, each being in accordance with pixel 200A of FIG. 10A. FIG. 13 shows that scan pulses 53a, 53b applied to scan line 52a of a first pixel circuit 51a and then scan line 52b of a second pixel circuit 51b, and the consequential current 55a drawn through the signal line 54. When the scan pulses are high, the current increases in magnitude, but becomes more negative.

As was discussed above, the predetermined brightness of the luminescence transistor is repetitively set in synchronization with a scan cycle.

The scan cycle refers to a cycle at which a pulse voltage is applied to a scan line on a regular basis. Every time a pulse voltage is applied, an appropriate pixel brightness setting is updated. This allows a predetermined brightness to be repetitively set in an appropriate pixel.

Figure 14:
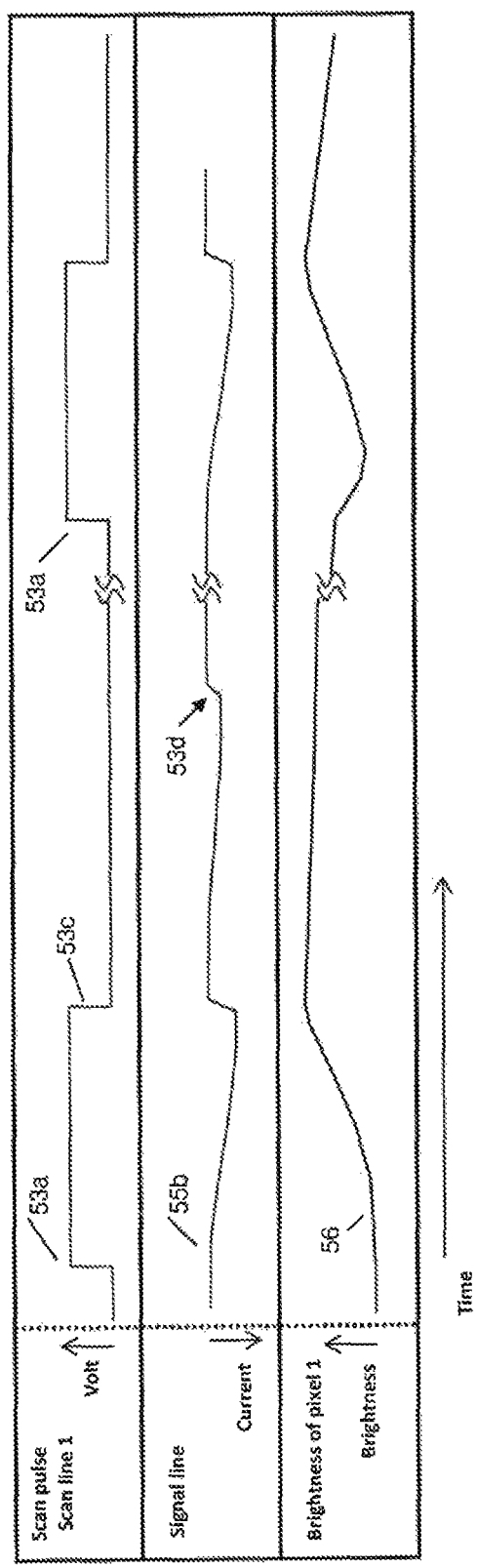
FIG. 14 illustrates, for the portion of the active matrix illustrated in FIG. 12, the current signal into the signal line and the brightness of light emitted from one of the pixel circuits, when the pixel circuit is iteratively pulsed in successive scan cycles.

FIG. 14 shows a scan pulse 53a is repetitively applied through the scan line 52a and the resulting current 55b in the signal line 54 in synchronization to set the brightness 56 of the first pixel circuit pixel 51a. The signal current 55b shows an increase in negative magnitude at 53d due to a pulse on a different scan (eg scan line 52b), so does not affect the current brightness signal 56 from pixel circuit 51a. When the scan pulse on scan line 54 stops at 53c, the brightness it mostly sustained until the brightness information is updated at the next cycle. This driving method is suitable for high scan rate 30 frames per second or higher.

Figure 15:
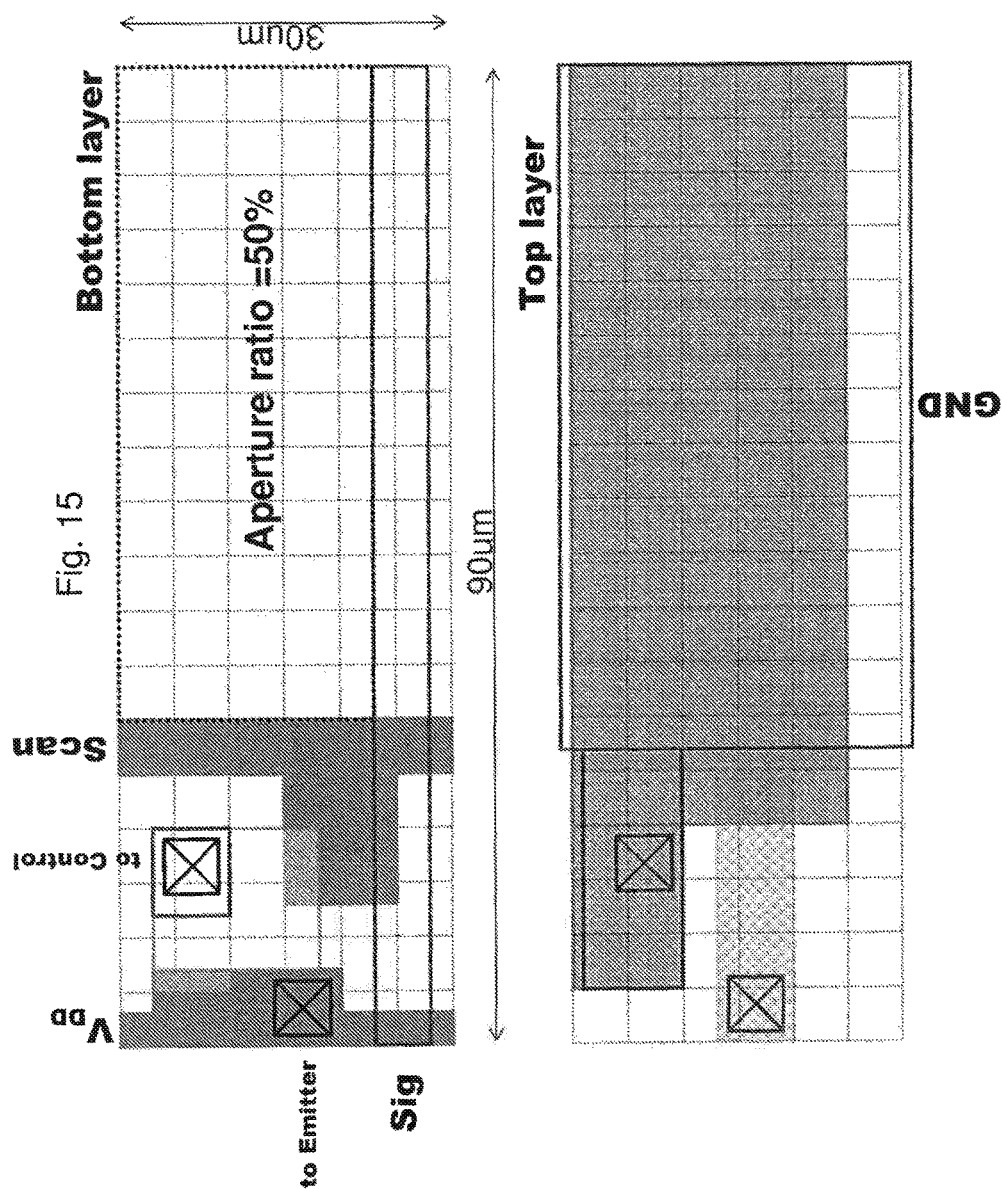
FIG. 15 shows an exemplary layout of a pixel for an active matrix display.
Figure 16:
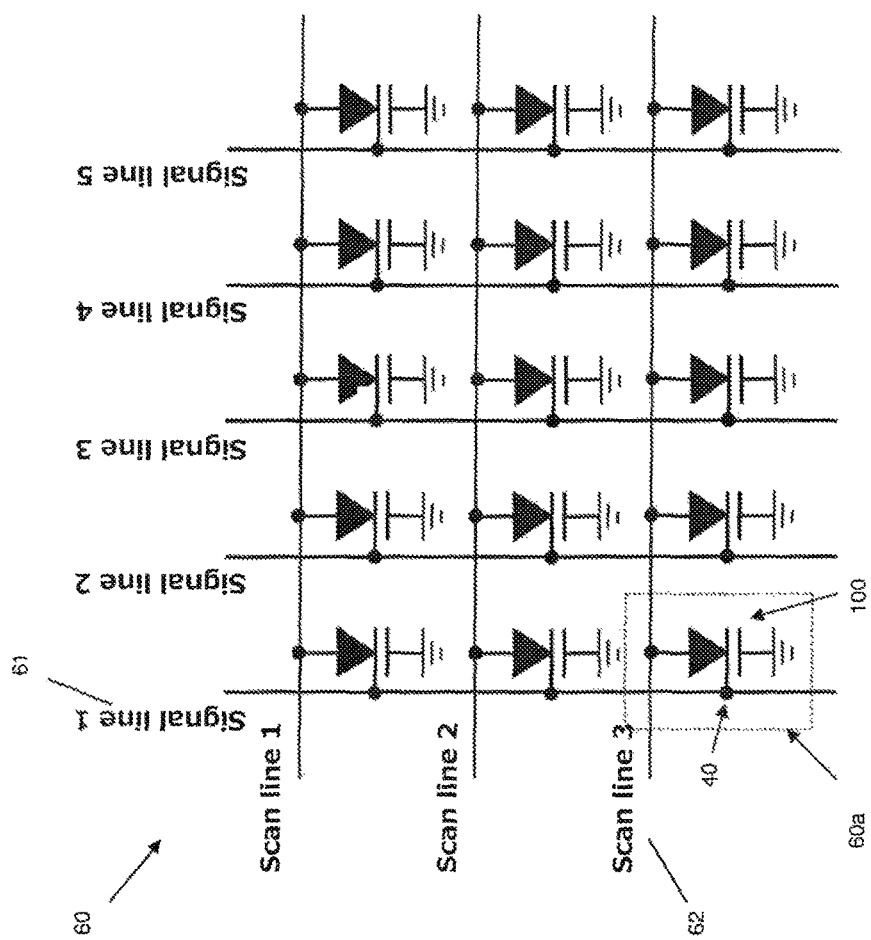
FIG. 16 shows a passive matrix for an array of electroluminescent devices according to the present invention.

FIG. 15 shows an exemplary layout of a pixel for a RGB active matrix colour display, based on a luminescence transistor according to the present invention and using two TFTs in the backplane to drive and control the luminescence transistor. The layout shows a scale of 5 µm line/space. This layout achieves an aperture ratio (ie the proportion of the pixel that provides luminescence) of 50%. Advantageously, this ratio is significantly larger than 30% ratio generally achievable with FET-type luminescence transistors Passive Matrix Configuration FIG. 16 shows a passive matrix pixel circuit 60 for driving electroluminescent devices in accordance with the present invention. The passive matrix pixel circuit 60 includes a plurality of single pixel circuits 60a. Each single pixel circuit 60a has a first control line (eg a signal line) 61 coupled to an input electrode 40 of the electroluminescent device 100 for setting a voltage at the input electrode, and a second control line (eg a scan line) 62 connected to the electroluminescent device for applying a voltage between an anode and a cathode of the device. The first and second control lines are synchronised such that the first control line provides a pulse that controls luminescence emitted from the electroluminescent device. The scan lines of each matrix circuit are also connected to a scan controller and the signal lines of each matrix circuit are also connected to a signal controller (not shown). A multiplexing drive (not shown) for the passive matrix circuit 60 is configured such that signal controller and scan controller of each circuit are arranged to independently control each pixel circuit.

It will be understood that the invention disclosed and defined in this specification extends to all alternative combinations of two or more of the individual features mentioned or evident from the text or drawings. All of these different combinations constitute various alternative aspects of the invention.

The invention claimed is:

1. A pixel matrix circuit comprising a plurality of pixel circuits, each comprising an electroluminescent device comprising an organic electroluminescent element and a junction transistor having a first region, a second region, and an intermediate semiconducting region configured to control flow of charge between the first and second regions, wherein at least two abutting regions consist essentially of one or more semiconducting inorganic metal compounds, and wherein each region of the junction transistor and the electroluminescent element are successively stacked along a common direction, wherein the electroluminescent device is connected to a matrix circuit controlling operation of the electroluminescent device, wherein each pixel circuit comprises:
    a first control line coupled to an input electrode of the electroluminescent device configured for setting a voltage at the input electrode; and
    a second control line connected to the electroluminescent device configured for applying a voltage between an anode and cathode of the device;
    wherein the first and second control lines are synchronised such that the first control line provides a pulse that controls luminescence emitted from the electroluminescent device, wherein for each electroluminescent device the second control lines of each pixel circuit are connected to a scan controller and the first control lines of each pixel circuit are also connected to a signal controller.

2. The pixel circuit according to claim 1, wherein the electroluminescent device is a luminescence transistor.

3. The pixel circuit according to claim 1, wherein the intermediate semiconducting region is a base region, the first region is an emitter region, the second region is a collector region, and the base region and at least one of the emitter region or collector region are abutting regions.

4. The pixel circuit according to claim 1, wherein the electroluminescent element and each region of the junction transistor are successively stacked along a vertical direction.

5. The pixel circuit according to claim 1, wherein the electroluminescent element and each region of the junction transistor are layers that overlie each other.

6. The pixel circuit according to claim 1, wherein the organic electroluminescent element is distinct from and abuts the junction transistor.

7. The pixel circuit according to claim 1, wherein the intermediate semiconducting region and the first region are two abutting regions and consist essentially of one or more semiconducting inorganic metal compounds selected from the group consisting of metal oxides, nitrides, sulphides and carbides, and the second region comprises one or more charge transporting organic carrier materials or metals.

8. The pixel circuit according to claim 7, wherein the first region comprises one or more charge transporting organic carrier materials or metals having a work function <2.5 eV or >4.0 eV.

9. The pixel circuit according to claim 1, wherein the intermediate semiconducting region consist essentially of one or more semiconducting inorganic metal compounds selected from the group consisting of Zn, Cu, Ru, Al, In, Ga, Sn and Ti oxides.

10. The pixel circuit according to claim 1, wherein the intermediate semiconducting region has a structure of stacked laminae comprised of two or more layers of semiconductor materials, wherein the two or more layers include a high resistive layer and a low resistive layer.

11. The pixel circuit according to claim 1, wherein the intermediate semiconducting region has a structure where a high resistive layer and a conductive or low resistive layer are laminated to form two layers.

12. The pixel circuit according to claim 1, wherein the second region consists essentially of one or more semiconductor materials selected from the group consisting of Zn, Cu, Ru, Al, In, Ga, Sn and Ti oxides.

13. The pixel circuit according to claim 1, wherein the first region consists essentially of one or more semiconductor materials selected from the group consisting of Zn, Cu, Ru, Al, In, Ga, Sn and Ti oxides.

14. The pixel circuit according to claim 1, wherein the junction transistor is transparent.

15. The pixel circuit according to claim 1, wherein the electroluminescent device is configured such that light is generated from an organic light emission layer within the electroluminescent element, wherein the light emission layer is located between the junction transistor and further layers of the electroluminescent element, and wherein light generated from the light emission layer is transmitted through the further layers of the organic electroluminescent element and is reflected by a reflector region located between the junction transistor and a substrate.

16. The pixel circuit according to claim 1, wherein the light transmitted from the electroluminescent device is at least 30% of incident light.

17. The pixel circuit according to claim 1, connected to a control circuit controlling operation of the electroluminescent device, wherein the control circuit comprises:

a switch;
a current setting transistor; and
a capacitor.

18. The pixel circuit according to claim 17, wherein
the switch is configured to selectively couple a first control line to an input electrode of the electroluminescent device for setting a voltage at the input electrode when the switch is on, and is a thin film transistor (TFT) having a gate connected to a second control line and source and drain configured for said coupling of the first control line to the input electrode;
the current setting transistor is configured to deliver into or draw current out of the electroluminescent device, via said input electrode, when the current setting transistor is in a biased state and is a TFT having a gate connected to the capacitor; and
the capacitor is configured to prolong the current setting transistor in the biased state when the switch is turned off so as to prolong said delivered or drawn current.

19. The pixel circuit according to claim 17, wherein the switch additionally selectively couples the first control line to configure the current setting transistor in a biased state when the switch is on, and Wherein the pixel circuit further comprises a second switch that selectively couples the first control line to set the voltage at the input electrode when the second switch is on, wherein the capacitor is isolated from the input electrode.

20. An electroluminescent display panel comprising,
a front plane and a hack plane,
wherein the front plane includes an electroluminescent device according to claim 1 and the back plane includes a control circuit including at least two TFTs and at least one capacitor.

21. The electroluminescent display panel according to claim 20, wherein the TFTs are selected from the group consisting of polycrystalline Si TFT, amorphous Si ITT, oxide TFT and organic TFT.

22. An electroluminescent display panel according to claim 20 wherein the electroluminescent device, the at least two TFTs, and the at least one capacitor are configured to form a pixel circuit wherein the electroluminescent device is connected to a control circuit controlling operation of the electroluminescent device, wherein the control circuit comprises a switch, a current setting transistor and a capacitor.

23. A method of manufacturing the electroluminescent display panel in accordance with claim 20, comprising manufacturing the back plane by a first process performed at or above 1000° C. and manufacturing the front plane by a second process different from the first process and performed at or below 300° C., wherein the second process deposits one or more organic layers including at least the electroluminescent element on the layers consisting of one or more semiconducting inorganic metal.

24. A method for manufacturing the pixel matrix circuit comprising a plurality of pixel circuits, each comprising an electroluminescent device in accordance with claim 1, comprising:
a) depositing layers consisting of one or more semiconducting inorganic metal compounds by sputtering; and thereafter
b) depositing the electroluminescent element by vacuum deposition.

* * * * *